(12) United States Patent
Jacobson et al.

(10) Patent No.: US 7,667,684 B2
(45) Date of Patent: Feb. 23, 2010

(54) METHODS FOR ACHIEVING IMPROVED COLOR IN MICROENCAPSULATED ELECTROPHORETIC DEVICES

(75) Inventors: Joseph M. Jacobson, Newton Centre, MA (US); Ian D. Morrison, Acton, MA (US); Russell J. Wilcox, Natick, MA (US); Paul Drzaic, Lexington, MA (US)

(73) Assignee: E Ink Corporation, Cambridge, MA (US)

( * ) Notice: Subject to any disclaimer, the term of this patent is extended or adjusted under 35 U.S.C. 154(b) by 989 days.

(21) Appl. No.: 10/817,464

(22) Filed: Apr. 2, 2004

(65) Prior Publication Data

US 2004/0190114 A1    Sep. 30, 2004

Related U.S. Application Data

(63) Continuation of application No. 09/349,806, filed on Jul. 8, 1999, now abandoned.

(60) Provisional application No. 60/092,050, filed on Jul. 8, 1998.

(51) Int. Cl.
*G09G 3/34* (2006.01)
(52) U.S. Cl. ...................................... 345/107
(58) Field of Classification Search .................. 345/107
See application file for complete search history.

(56) References Cited

U.S. PATENT DOCUMENTS

| | | | |
|---|---|---|---|
| 3,036,388 A | 5/1962 | Tate | |
| 3,384,488 A | 5/1968 | Tulagin et al. | |
| 3,406,363 A | 10/1968 | Tate | |
| 3,460,248 A | 8/1969 | Tate | |
| 3,585,381 A | 6/1971 | Hodson et al. | |
| 3,612,758 A * | 10/1971 | Evans et al. | 348/803 |

(Continued)

FOREIGN PATENT DOCUMENTS

DE      195 00 694 A1    8/1996

(Continued)

OTHER PUBLICATIONS

Kimlin, Administrative Patent Judge; Full Color Reflective Display with Multichromatic Sub-Pixels; Mar. 24, 2004; 1-9; Decision on Appeal No. 2004-0103.

(Continued)

*Primary Examiner*—Sumati Lefkowitz
*Assistant Examiner*—Ke Xiao
(74) *Attorney, Agent, or Firm*—David J. Cole

(57) ABSTRACT

A method for manufacturing a full color, reflective display includes the steps of depositing a first plurality of electrophoretic display elements in substantial registration with a first electrode and a second plurality of electrophoretic display elements in substantial registration with a second electrode. The electrophoretic display elements include a capsule containing a species of particles dispersed in a suspending fluid. The selective deposition of the display elements can be achieved by ink-jet printing methods, screen printing methods or other printing methods. In some embodiments the electrodes are printed onto the substrate before selective deposition of the display elements, while in other embodiments the substrate is provided having the electrodes already disposed on it. In still other embodiments, the sequence of printing of electrodes and electrophoretic display elements can be varied.

8 Claims, 12 Drawing Sheets

U.S. PATENT DOCUMENTS

| | | | |
|---|---|---|---|
| 3,668,106 A | 6/1972 | Ota | |
| 3,670,323 A | 6/1972 | Sobel et al. | |
| 3,756,693 A | 9/1973 | Ota | |
| 3,767,392 A | 10/1973 | Ota | |
| 3,772,013 A | 11/1973 | Wells | |
| 3,792,308 A | 2/1974 | Ota | |
| 3,850,627 A | 11/1974 | Wells et al. | |
| 3,892,568 A | 7/1975 | Ota | |
| 4,041,481 A | 8/1977 | Sato | |
| 4,045,327 A | 8/1977 | Noma et al. | |
| 4,062,009 A | 12/1977 | Raverdy et al. | |
| 4,068,927 A | 1/1978 | White | |
| 4,071,430 A | 1/1978 | Liebert | |
| 4,088,395 A | 5/1978 | Gigila | |
| 4,093,534 A | 6/1978 | Carter et al. | |
| 4,123,346 A | 10/1978 | Ploix | |
| 4,126,528 A | 11/1978 | Chiang | |
| 4,126,854 A | 11/1978 | Sheridon | |
| 4,143,472 A | 3/1979 | Murata et al. | |
| 4,147,932 A | 4/1979 | Lewis | |
| 4,149,149 A | 4/1979 | Miki et al. | |
| 4,203,106 A | 5/1980 | Dalisa et al. | |
| 4,211,668 A | 7/1980 | Tate | |
| 4,218,302 A | 8/1980 | Dalisa et al. | |
| 4,231,641 A | 11/1980 | Randin | |
| 4,261,653 A | 4/1981 | Goodrich | |
| 4,272,596 A | 6/1981 | Harbour et al. | |
| 4,298,448 A | 11/1981 | Müller et al. | |
| 4,305,807 A | 12/1981 | Somiyody | |
| 4,311,361 A | 1/1982 | Somiyody | |
| 4,314,013 A | 2/1982 | Chang | |
| 4,324,456 A | 4/1982 | Dalisa | |
| 4,390,403 A | 6/1983 | Batchelder | |
| 4,418,346 A | 11/1983 | Batchelder | |
| 4,430,648 A | 2/1984 | Togashi et al. | |
| 4,438,160 A | 3/1984 | Ishikawa et al. | |
| 4,450,440 A | 5/1984 | White | |
| 4,522,472 A | 6/1985 | Liebert et al. | |
| 4,598,960 A | 7/1986 | DiSanto et al. | |
| 4,643,528 A | 2/1987 | Bell | |
| 4,648,956 A | 3/1987 | Marshall et al. | |
| 4,655,897 A | 4/1987 | DiSanto et al. | |
| 4,732,830 A | 3/1988 | DiSanto et al. | |
| 4,742,345 A | 5/1988 | DiSanto et al. | |
| 4,748,366 A | 5/1988 | Taylor | |
| 4,772,102 A | 9/1988 | Fergason et al. | |
| 4,772,820 A | 9/1988 | DiSanto et al. | |
| 4,794,390 A | 12/1988 | Lippman | |
| 4,824,208 A | 4/1989 | Fergason et al. | |
| 4,832,458 A | 5/1989 | Fergason et al. | |
| 4,850,919 A | 7/1989 | DiSanto et al. | |
| 4,892,607 A | 1/1990 | DiSanto et al. | |
| 4,909,959 A | 3/1990 | Lemaire et al. | |
| 4,919,521 A | 4/1990 | Tada et al. | |
| 4,947,219 A | 8/1990 | Boehm | |
| 5,006,212 A | 4/1991 | DiSanto et al. | |
| 5,016,002 A | 5/1991 | Levanto | |
| 5,017,225 A | 5/1991 | Nakanishi et al. | |
| 5,028,841 A | 7/1991 | DiSanto et al. | |
| 5,041,824 A | 8/1991 | DiSanto et al. | |
| 5,053,763 A | 10/1991 | DiSanto et al. | |
| 5,057,363 A | 10/1991 | Nakanishi | |
| 5,066,105 A | 11/1991 | Yoshimoto et al. | |
| 5,066,946 A | 11/1991 | Disanto et al. | |
| 5,070,326 A | 12/1991 | Yoshimoto et al. | |
| 5,077,157 A | 12/1991 | DiSanto et al. | |
| 5,082,351 A | 1/1992 | Fergason | |
| 5,105,185 A | 4/1992 | Nakanowatari et al. | |
| 5,128,785 A | 7/1992 | Yoshimoto et al. | |
| 5,138,472 A | 8/1992 | Jones et al. | |
| 5,151,032 A | 9/1992 | Igawa | |
| 5,161,007 A | 11/1992 | Takanashi et al. | |
| 5,174,882 A | 12/1992 | DiSanto et al. | |
| 5,177,476 A | 1/1993 | DiSanto et al. | |
| 5,185,226 A | 2/1993 | Grosso et al. | |
| 5,187,609 A | 2/1993 | DiSanto et al. | |
| 5,208,686 A | 5/1993 | Fergason | 359/51 |
| 5,216,416 A | 6/1993 | DiSanto et al. | |
| 5,220,316 A | 6/1993 | Kazan | |
| 5,223,115 A | 6/1993 | DiSanto et al. | |
| 5,223,823 A | 6/1993 | Disanto et al. | |
| 5,250,932 A | 10/1993 | Yoshimoto et al. | |
| 5,250,938 A | 10/1993 | DiSanto et al. | |
| 5,254,981 A | 10/1993 | Disanto et al. | |
| 5,266,934 A | 11/1993 | Van Almen | |
| 5,266,937 A | 11/1993 | DiSanto et al. | |
| 5,276,438 A | 1/1994 | DiSanto et al. | |
| 5,279,511 A | 1/1994 | DiSanto et al. | |
| 5,279,694 A | 1/1994 | DiSanto et al. | |
| 5,293,528 A | 3/1994 | DiSanto et al. | |
| 5,298,833 A | 3/1994 | Hou | |
| 5,302,235 A | 4/1994 | DiSanto et al. | |
| 5,303,073 A | 4/1994 | Shirota et al. | |
| 5,304,439 A | 4/1994 | Disanto et al. | |
| 5,315,312 A | 5/1994 | DiSanto et al. | |
| 5,345,251 A | 9/1994 | DiSanto et al. | |
| 5,345,322 A | 9/1994 | Fergason | 359/53 |
| 5,359,346 A | 10/1994 | DiSanto et al. | |
| 5,380,362 A | 1/1995 | Schubert | |
| 5,389,945 A | 2/1995 | Sheridon | |
| 5,402,145 A | 3/1995 | Disanto et al. | |
| 5,403,518 A | 4/1995 | Schubert | |
| 5,411,398 A | 5/1995 | Nakanishi et al. | |
| 5,411,656 A | 5/1995 | Schubert | |
| 5,412,398 A | 5/1995 | DiSanto et al. | |
| 5,421,926 A | 6/1995 | Yukinobu et al. | |
| 5,460,688 A | 10/1995 | DiSanto et al. | |
| 5,463,492 A | 10/1995 | Check, III | |
| 5,467,107 A | 11/1995 | DiSanto et al. | |
| 5,508,720 A | 4/1996 | DiSanto et al. | |
| 5,512,162 A | 4/1996 | Sachs et al. | |
| 5,543,219 A | 8/1996 | Elwakil | |
| 5,561,443 A | 10/1996 | Disanto et al. | |
| 5,565,885 A | 10/1996 | Tamanoi | |
| 5,573,711 A | 11/1996 | Hou et al. | |
| 5,575,554 A | 11/1996 | Guritz | |
| 5,582,700 A | 12/1996 | Bryning et al. | |
| 5,627,561 A | 5/1997 | Laspina et al. | |
| 5,635,317 A | 6/1997 | Taniguchi et al. | |
| 5,643,673 A | 7/1997 | Hou | |
| 5,650,872 A | 7/1997 | Saxe et al. | |
| 5,684,501 A | 11/1997 | Knapp et al. | |
| 5,686,383 A | 11/1997 | Long et al. | |
| 5,689,282 A | 11/1997 | Wolfs et al. | |
| 5,707,738 A | 1/1998 | Hou | |
| 5,707,747 A | 1/1998 | Tomiyama et al. | |
| 5,708,525 A | 1/1998 | Sheridon | |
| 5,709,976 A | 1/1998 | Malhotra | |
| 5,714,051 A | 2/1998 | Leth et al. | |
| 5,716,550 A | 2/1998 | Gardner et al. | |
| 5,717,283 A | 2/1998 | Biegelsen et al. | |
| 5,717,514 A | 2/1998 | Sheridon | |
| 5,717,515 A | 2/1998 | Sheridon | |
| 5,721,042 A | 2/1998 | Iijima et al. | |
| 5,725,935 A | 3/1998 | Rajan | |
| 5,731,116 A | 3/1998 | Matsuo et al. | |
| 5,737,115 A | 4/1998 | Mackinlay et al. | |
| 5,738,977 A | 4/1998 | Van Der Voort et al. | |
| 5,739,801 A | 4/1998 | Sheridon | |
| 5,744,283 A | 4/1998 | Spierings et al. | |
| 5,745,094 A | 4/1998 | Gordon, II et al. | |
| 5,750,238 A | 5/1998 | Iijima et al. | |
| 5,751,268 A | 5/1998 | Sheridon | |
| 5,754,332 A | 5/1998 | Crowley | |

| | | | |
|---|---|---|---|
| 5,759,671 A | 6/1998 | Tanaka et al. | |
| 5,760,761 A | 6/1998 | Sheridon | |
| 5,767,826 A * | 6/1998 | Sheridon et al. | 345/84 |
| 5,786,875 A | 7/1998 | Brader et al. | |
| 5,808,783 A | 9/1998 | Crowley | |
| 5,825,529 A | 10/1998 | Crowley | |
| 5,828,432 A | 10/1998 | Shashidhar et al. | |
| 5,835,577 A | 11/1998 | DiSanto et al. | |
| 5,843,259 A | 12/1998 | Narang et al. | |
| 5,872,552 A * | 2/1999 | Gordon et al. | 345/107 |
| 5,894,367 A | 4/1999 | Sheridon | |
| 5,900,858 A | 5/1999 | Richley | |
| 5,930,026 A | 7/1999 | Jacobson et al. | |
| 5,975,680 A | 11/1999 | Wen et al. | 347/43 |
| 6,177,921 B1 | 1/2001 | Comiskey et al. | 345/107 |
| 6,323,989 B1 | 11/2001 | Jacobson et al. | 345/107 |

FOREIGN PATENT DOCUMENTS

| | | |
|---|---|---|
| EP | 0 186 710 A1 | 7/1986 |
| EP | 0 240 063 B1 | 10/1987 |
| EP | 0 268 877 A2 | 6/1988 |
| EP | 0 281 204 A2 | 9/1988 |
| EP | 0 323 656 B1 | 7/1989 |
| EP | 0 325 013 A1 | 7/1989 |
| EP | 0 325 013 B1 | 7/1989 |
| EP | 0 344 367 A1 | 12/1989 |
| EP | 0 344 367 B1 | 12/1989 |
| EP | 0 361 420 A2 | 4/1990 |
| EP | 0 396 247 A2 | 11/1990 |
| EP | 0 396 247 B1 | 11/1990 |
| EP | 0 404 545 A2 | 12/1990 |
| EP | 0 442 123 A1 | 8/1991 |
| EP | 0 443 571 A2 | 8/1991 |
| EP | 0 448 853 A1 | 10/1991 |
| EP | 0 448 853 B1 | 10/1991 |
| EP | 0 525 852 A1 | 2/1993 |
| EP | 0 525 852 B1 | 2/1993 |
| EP | 0 570 995 A1 | 11/1993 |
| EP | 0 570 995 B1 | 11/1993 |
| EP | 0 575 475 B1 | 12/1993 |
| EP | 0 586 373 B1 | 3/1994 |
| EP | 0 586 545 B1 | 3/1994 |
| EP | 0 601 072 B1 | 6/1994 |
| EP | 0 601 075 B1 | 6/1994 |
| EP | 0 684 579 A2 | 11/1995 |
| EP | 0 709 713 A2 | 5/1996 |
| EP | 0 721 176 A2 | 7/1996 |
| EP | 0 721 176 A3 | 11/1996 |
| EP | 0 595 812 B1 | 12/1996 |
| EP | 0 924 551 A1 | 6/1999 |
| GB | 1 314 906 | 4/1973 |
| GB | 1 465 701 | 3/1977 |
| GB | 2 044 508 A | 10/1980 |
| GB | 2 306 229 A | 4/1997 |
| JP | 53-73098 | 6/1978 |
| JP | 55096922 | 7/1980 |
| JP | 60189731 | 9/1985 |
| JP | 60197565 | 3/1987 |
| JP | 62058222 | 3/1987 |
| JP | 61074292 | 10/1987 |
| JP | 62231930 | 10/1987 |
| JP | 62269124 | 11/1987 |
| JP | 62299824 | 12/1987 |
| JP | 64-86116 | 3/1989 |
| JP | 01086116 | 3/1989 |
| JP | 01086117 A | 3/1989 |
| JP | 01086118 | 3/1989 |
| JP | 2551783 | 3/1989 |
| JP | 01142537 A | 6/1989 |
| JP | 01177517 | 7/1989 |
| JP | 1177517 A | 7/1989 |
| JP | 01248182 A | 10/1989 |
| JP | 01267525 | 10/1989 |
| JP | 02223934 A | 9/1990 |
| JP | 02223935 A | 9/1990 |
| JP | 02223936 A | 9/1990 |
| JP | 02284124 A | 11/1990 |
| JP | 02284125 A | 11/1990 |
| JP | 04345133 A | 12/1992 |
| JP | 5-61421 | 3/1993 |
| JP | 05165064 A | 6/1993 |
| JP | 05173194 A | 7/1993 |
| JP | 05307197 A | 11/1993 |
| JP | 6089081 | 3/1994 |
| JP | 9385609 | 3/1994 |
| JP | 6-202168 | 7/1994 |
| JP | 07036020 | 2/1995 |
| JP | 0 8234176 | 9/1996 |
| JP | 9-6277 | 1/1997 |
| JP | 9031453 A | 2/1997 |
| JP | 9-185087 | 7/1997 |
| JP | 9-211499 | 8/1997 |
| JP | 09230391 | 9/1997 |
| JP | 10-48673 | 2/1998 |
| JP | 10-149118 A | 6/1998 |
| JP | 10-161161 | 6/1998 |
| WO | WO 82/02961 | 9/1982 |
| WO | WO 92/17873 | 10/1992 |
| WO | WO 92/20060 | 11/1992 |
| WO | WO 92/21733 | 12/1992 |
| WO | WO 93/02443 | 2/1993 |
| WO | WO 93/04458 | 3/1993 |
| WO | WO 93/04459 | 3/1993 |
| WO | WO 93/05425 | 3/1993 |
| WO | WO 93/07608 | 4/1993 |
| WO | WO 93/17414 | 9/1993 |
| WO | WO 95/02636 | 1/1995 |
| WO | WO 95/05622 | 2/1995 |
| WO | WO 95/06307 | 3/1995 |
| WO | WO 95/07527 | 3/1995 |
| WO | WO 95/10107 | 4/1995 |
| WO | WO 95/15363 | 6/1995 |
| WO | WO 95/27924 | 10/1995 |
| WO | WO 95/33085 | 12/1995 |
| WO | WO 97/04398 | 2/1997 |
| WO | WO 97/35298 | 9/1997 |
| WO | WO 98/03896 | 1/1998 |
| WO | WO 98/19208 | 5/1998 |
| WO | WO 98/41898 | 9/1998 |
| WO | WO 98/41899 | 9/1998 |
| WO | WO 98/58383 | 12/1998 |
| WO | WO 99/04631 | 2/1999 |
| WO | WO 99/10767 | 3/1999 |
| WO | WO 99/10768 | 3/1999 |
| WO | WO 99/12170 | 3/1999 |
| WO | WO 99/14762 | 3/1999 |
| WO | WO 99/14763 | 3/1999 |
| WO | WO 99/20682 | 4/1999 |
| WO | WO 99/45416 | 9/1999 |
| WO | WO 99/53373 | 10/1999 |

OTHER PUBLICATIONS

Poteate, Administrative Patent Judge; Full Color Reflective Display with Multichromatic Sub-Pixels; Sep. 26, 2003; 1-7; Decison on Appeal No. 2003-1345.

Waltz, Administrative Patent Judge; Color Electrophoretic Displays; Jun. 17, 2004; 1-12; Decision on Appeal No. 2003-0784.

Sankus, "Electrophoretic Display Cell," *Xerox Disclosure Journal,* vol. 4, No. 3, May/Jun. 1979.

Platt, "Digital Ink," *Wired,* May 1997, pp. 162-165, 208-211.

Beilin et al, "2000-Character Electrophoretic Display," *SID 86 Digest,* 1980, pp. 136-140.

Blazo, "High Resolution Electrophoretic Display with Photoconductor Addressing," *SID 82 Digest,* 1982, pp. 92-93.

Bohnke et al., "Polymer-Based Solid Electrochromic Cell for Matrix-Addressable Display Devices," *J. Electrochem. Soc.*, vol. 138, No. 12, Dec. 1991, pp. 3612-3617.

Chiang et al., "A High Speed Electrophoretic Matrix Display," *SID 80 Digest*, 1980, pp. 114-115.

Comiskey et al., "Electrophoretic Ink: A Printable Display Material," *SID 97 Digest*, 1997, pp. 75-76.

Croucher et al., "Electrophoretic Display: Materials as Related to Performance," *Photographic Science and Engineering*, vol. 25, No. 2, Mar./Apr. 1981, pp. 80-86.

Dalisa, "Electrophoretic Display Technology," *Transactions on Electron Devices*, vol. 24, No. 7, Jul. 1977, pp. 827-834.

Egashira et al., "A Solid Electrochromic Cell Consisting of Lu-Diphthaocyanine and Lead Fluoride," *Proceeding of the SID*, vol. 28, No. 3, 1987, pp. 227-232.

Fitzhenry-Ritz, "Optical Properties of Electrophorectic Image Displays," *Proceeding of the SID*, vol. 24, No. 4, 1981, pp. 300-309.

Goodman, "Passive Liquid Displays: Liquid Crystals, Electrophoretics, and Electrochromics," *Proceeding of the SID*, vol. 17, No. 1, 1976, pp. 30-38.

Gutcho, "Additional Uses for Encapsulated Products," *Microcapsules and Microencapsulation Techniques*, pp. 278-343.

Hosaka et al., "Electromagnetic Microrelays: Concepts and Fundamental Characteristics," *Sensors and Actuators A.*, vol. 40, 1994, pp. 41-47.

Kornfeld, "A Defect-Tolerant Active Matrix Electrophoretic Display," *SID 84 Digest*, 1984, pp. 142-144.

Lee, "Fabrication of Magnetic Particles Displays," *Proceeding of the S.I.D.*, vol. 18, Nos. 3 & 4, 1977, pp. 283-288.

Lewis et al., "Gravitational, Inter-Particle and Particle-Electrode Forces in the Electrophoretic Display," *Proceeding of the SID*, vol. 18, Nos. 3 & 4, pp. 235-242.

Moesner et al., "Devices for Particle Handling by an AC Electric Field," *1995 IEEE*, 1995, pp. 66-71.

Murau, "Characteristics of an X-Y Addressed Electrophorectic Image Display (EPID)," *SID 84 Digest*, 1984, p. 141.

Mürau et al., "The Understanding and Elimination of Some Suspension Instabilities in an Electrophoretic Display," *J. Appl. Phys.*, vol. 49, No. 9, 1978, pp. 4820-4829.

Ota et al., "Developments in Electrophoretic Displays," *Proceedings of the SID*, vol. 18, Nos. 3 & 4, 1977, pp. 243-254.

Ota et al., "Electrophoretic Display Devices", *Laser 75 Optoelectronics Conference Proceedings*, pp. 145-148.

Ota et al., "Electrophoretic Image Display (EPID) Panel," *Proceedings of the IEEE*, 1973, pp. 1-5.

Ziemelis, "Putting it on Plastic," *Nature*, vol. 393, Jun. 18, 1998, pp. 619-620.

Pankove, "Color Reflection Type Display Panel," *RCA Technical Notes*, No. 535, Mar. 1962, pp. 1-2.

Pearlstein, "Electroless Plating," *Modern Electroplating*, pp. 710-747.

Saitoh et al., "A Newly Developed Electrical Twisting Ball Display," *Proceedings of the SID*, vol. 23, No. 4, 1982, pp. 249-253.

"E Ink Debuts in J.C. Penney Stores," *Boston Herald*, May 3, 1999, pp. 27.

Sheridon et al., "The Gyricon-A Twisting Ball Display," *Proceeding of the SID*, vol. 18, Nos. 3 & 4, 1977, pp. 289-293.

Sheridon et al., "A Photoconductor-Addressed Electrophoretic Cell for Office Data Display," *SID 82 Digest*, 1982, pp. 94-95.

Shiwa et al., "Electrophoretic Display Method Using Ionographic Technology," *SID 88 Digest*, 1988, pp. 61-62.

Singer et al., "An X-Y Addressable Electrophoretic Display," *Proceeding of the SID*, vol. 18, Nos. 3 & 4, 1977, pp. 255-266.

Yang et al., "A New Architecture for Polymer Transistors," *Nature*, vol. 372, No. 24, Nov. 1994, pp. 344-346.

Negroponte et al., "Surfaces and Displays," *Wired*, Jan. 1997, p. 212.

Bao. et al., "High-Performance Plastic Transistors Fabricated by Printing Techniques," *Chem. Mater.*, vol. 9, No. 6, 1997, pp. 1299-1301.

Hopper et al., "An Electrophoretic Display, Its Properties, Model, and Addressing," *Transactions on Electron Devices*, vol. Ed-26, No. 8, Aug. 1979, pp. 1148-1152.

White, "An Electrophoretic Bar Graph Display," *Proceedings of the SID*, vol. 22, No. 3, 1981, pp. 173-180.

Nakamura et al., "Development of Electrophoretic Display Using Microcapsulated Suspension," *SID 98 Digest*, ,pp. 1014-1017.

* cited by examiner

METHODS FOR ACHIEVING IMPROVED COLOR IN MICROENCAPSULATED ELECTROPHORETIC DEVICES

CROSS-REFERENCE TO RELATED APPLICATIONS

This application is a continuation of prior application Ser. No. 09/349,806, filed on Jul. 8, 1999, which in turn claims priority to U.S. Ser. No. 60/092,050 filed Jul. 8, 1998, the contents of both being incorporated herein by reference.

FIELD OF THE INVENTION

The present invention relates to electronic displays and, in particular, to full color electrophoretic displays and methods of manufacturing full-color microencapsulated electrophoretic displays.

BACKGROUND OF THE INVENTION

Electrophoretic display media are generally characterized by the movement of particles through an applied electric field. These displays are highly reflective, can be made bistable, can be scaled to large areas, and consume very little power. These properties allow encapsulated electrophoretic display media to be used in many applications for which traditional electronic displays are not suitable. While bichromatic electrophoretic displays have been demonstrated in a limited range of colors (e.g. black/white or yellow/red), to date there has not been successful commercialization of a full-color electrophoretic display. One reason for this failure of commercialization is the lack of a method of manufacture that is efficient and inexpensive.

One traditional technique for achieving a bright, full-color display which is known in the art of emissive displays is to create display elements that are red, green and blue. In this system, each element has two states: on, or the emission of color; and off. Since light blends from these elements, the overall display can take on a variety of colors and color combinations. In an emissive display, the visual result is the summation of the wavelengths emitted by the display elements at selected intensities, white is seen when red, green and blue are all active in balanced-proportion. The brightness of the white image is controlled by the intensities of emission of light by the individual display elements. Black is seen when none are active or, equivalently, when all are emitting at zero intensity. As an additional example, a red visual display appears when the red display element is active while the green and blue are inactive, and thus only red light is emitted.

This method can be applied to bichromatic reflective displays, typically using the cyan-magenta-yellow subtractive color system. In this system, the reflective display elements absorb characteristic portions of the optical spectrum, rather than generating characteristic portions of the spectrum as do the elements in an emissive display. White reflects everything, or equivalently absorbs nothing. A colored reflective material reflects light corresponding in wavelength to the color seen, and absorbs the remainder of the wavelengths in the visible spectrum. To achieve a black display, all three display elements are turned on, and they absorb complementary portions of the spectrum.

However, such techniques require that the colored display elements be deposited onto a substrate in substantially equal proportions aligned with the proper addressing electrodes. Failure to achieve either substantially equal proportions of colored display elements or failure to achieve-registration of the display elements with the addressing electrodes results in a color display that is unsatisfactory.

SUMMARY OF THE INVENTION

This invention teaches practical ways to efficiently and cheaply manufacture full-color, encapsulated electrophoretic displays. In one embodiment the display media can be printed and, therefore the display itself can be made inexpensively.

An encapsulated electrophoretic display can be constructed so that the optical state of the display is stable for some length of time. When the display has two states which are stable in this manner, the display is said to be bistable. If more than two states of the display are stable, then the display can be said to be multistable. For the purpose of this invention, the terms bistable and multistable, or generally, stable, will be used to indicate a display in which any optical state remains fixed once the addressing voltage is removed. The definition of a stable state depends on the application for the display. A slowly-decaying optical state can be effectively stable if the optical state is substantially unchanged over the required viewing time. For example, in a display which is updated every few minutes, a display image which is stable for hours or days is effectively bistable or multistable, as the case may be, for that application. In this invention, the terms bistable and multistable also indicate a display with an optical state sufficiently long-lived as to be effectively stable for the application in mind. Alternatively, it is possible to construct encapsulated electrophoretic displays in which the image decays quickly once the addressing voltage to the display is removed (i.e., the display is not bistable or multistable). As will be described, in some applications it is advantageous to use an encapsulated electrophoretic display which is not bistable or multistable. Whether or not an encapsulated electrophoretic display is stable, and its degree of stability, can be controlled through appropriate chemical modification of the electrophoretic particles, the suspending fluid, the capsule, binder materials, or addressing methods.

An encapsulated electrophoretic display may take many forms. The display may comprise capsules dispersed in a binder. The capsules may be of any size or shape. The capsules may, for example, be spherical and may have diameters in the millimeter range or the micron range, but is preferably from ten to a few hundred microns. The capsules may be formed by an encapsulation technique, as described below. Particles may be encapsulated in the capsules. The particles may be two or more different types of particles. The particles may be colored, luminescent, light-absorbing or transparent, for example. The particles may include neat pigments, dyed (laked) pigments or pigment/polymer composites, for example. The display may further comprise a suspending fluid in which the particles are dispersed.

The successful construction of an encapsulated electrophoretic display requires the proper interaction of several different types of materials and processes, such as a polymeric binder and, optionally, a capsule membrane. These materials must be chemically compatible with the electrophoretic particles and fluid, as well as with each other. The capsule materials may engage in useful surface interactions with the electrophoretic particles, or may act as a chemical or physical boundary between the fluid and the binder. Various materials and combinations of materials useful in constructing encapsulated electrophoretic displays are described in co-pending application Ser. No. 09/140,861, the contents of which are incorporated by reference herein.

In some cases, the encapsulation step of the process is not necessary, and the electrophoretic fluid may be directly dispersed or emulsified into the binder (or a precursor to the binder materials) and an effective "polymer-dispersed electrophoretic display" constructed. In such displays, voids created in the binder may be referred to as capsules or microcapsules even though no capsule membrane is present. The binder dispersed electrophoretic display may be of the emulsion or phase separation type.

Throughout the Specification, reference will be made to printing or printed. As used throughout the specification, printing is intended to include all forms of printing and coating, including: premetered coatings such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; silk screen printing processes; electrostatic printing processes; thermal printing processes; lithographic printing processes; ink-jet printing processes and other similar techniques. A "printed element" refers to an element formed using any one of the above techniques.

As noted above, electrophoretic display elements can be encapsulated. Throughout the Specification, reference will be made to "capsules," "elements," and "display elements." A capsule or display element may itself comprise one or more capsules or other structures.

In one aspect the present invention relates to a method for manufacturing a color electrophoretic display. A substrate is provided having at least two electrodes. A first plurality of electrophoretic display elements are disposed on the substrate in substantial registration with one of the electrodes. The first plurality of electrophoretic display elements includes capsules containing a first species of particles suspended in a dispersing fluid and having a first optical property. A second plurality of electrophoretic display elements is disposed on the substrate in substantial registration with the other electrode. The second plurality of electrophoretic display elements includes capsules containing a second species of particles suspended in a dispersing fluid and having a second optical property.

In another aspect the present invention relates to a method for manufacturing a color electrophoretic display. A substrate is provided. A first plurality of electrophoretic display elements are disposed on the substrate. The first plurality of electrophoretic display elements includes capsules containing a first species of particles suspended in a dispersing fluid and having a first optical property. At least one electrode is deposited on the first plurality of electrophoretic display elements.

In still another aspect the present invention relates to a method for manufacturing a color electrophoretic display. A substrate is provided and at least two electrodes are deposited on the substrate. A first plurality of electrophoretic display elements are disposed on the substrate in substantial registration with one of the electrodes. The first plurality of electrophoretic display elements includes capsules containing a first species of particles suspended in a dispersing fluid and having a first optical property. A second plurality of electrophoretic display elements is disposed on the substrate in substantial registration with the other electrode. The second plurality of electrophoretic display elements includes capsules containing a second species of particles suspended in a dispersing fluid and having a second optical property.

In yet another aspect the present invention relates to a method for manufacturing a color electrophoretic display. A substrate is provided and a first plurality of electrophoretic display elements are disposed on the substrate. The first plurality of electrophoretic display elements includes capsules containing a first species of particles suspended in a dispersing fluid and having a first optical property. A second substrate is provided and at least one electrode is deposited on the second substrate. The first and second substrate are disposed adjacent each other so that the display elements are adjacent the electrode.

BRIEF DESCRIPTION OF THE DRAWINGS

The invention is pointed out with particularity in the appended claims. The advantages of the invention described above, together with further advantages, may be better understood by referring to the following description taken in conjunction with the accompanying drawings. In the drawings, like reference characters generally refer to the same parts throughout the different views. Also, the drawings are not necessarily to scale, emphasis instead generally being placed upon illustrating the principles of the invention.

FIG. 4C depicts an embodiment of a manufacturing process that employs a flat platen for printing electrodes or display elements.

DETAILED DESCRIPTION OF THE INVENTION

Figure 1A:
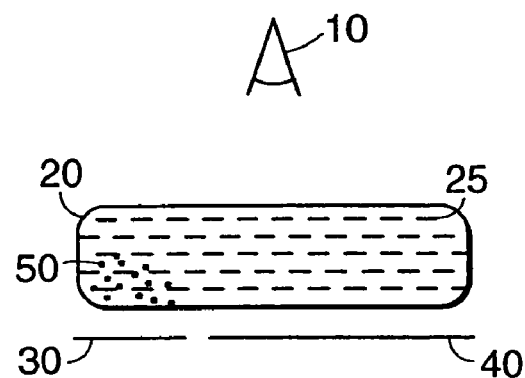
FIG. 1A is a diagrammatic side view of an embodiment of a rear-addressing electrode structure for a particle-based display in which a smaller electrode has been placed at a voltage relative to the large electrode causing the particles to migrate to the smaller electrode.

Electronic ink is an optoelectronically active material that comprises at least two phases: an electrophoretic contrast media phase and a coating/binding phase. The electrophoretic phase comprises, in some embodiments, a single species of electrophoretic particles dispersed in a clear or dyed medium, or more than one species of electrophoretic particles having distinct physical and electrical characteristics dispersed in a clear or dyed medium. In some embodiments the electrophoretic phase is encapsulated, that is, there is a capsule wall phase between the two phases. The coating/binding phase includes, in one embodiment, a polymer matrix that surrounds the electrophoretic phase. In this embodiment, the polymer in the polymeric binder is capable of being dried, crosslinked, or otherwise cured as in traditional inks, and therefore a printing process can be used to deposit the electronic ink onto a substrate.

In one embodiment, the ink may comprise display elements capable of displaying different colors. In one particular embodiment, some display elements contain red particles, some display elements contain green particles, and some display elements contain blue particles, respectively. In another particular embodiment, some display elements contain cyan particles, some display elements contain magenta particles, and some display elements contain yellow particles, respectively. By addressing each display element to display some fraction of its colored particles, a display can be caused to give an appearance corresponding to a selected color at a selected brightness level.

Electronic ink is capable of being printed by several different processes, depending on the mechanical properties of the specific ink employed. For example, the fragility or viscosity of a particular ink may result in a different process selection. A very viscous ink would not be well-suited to deposition by an inkjet printing process, while a fragile ink might not be used in a knife over roll coating process.

The optical quality of an electronic ink is quite distinct from other electronic display materials. The most notable difference is that the electronic ink provides a high degree of both reflectance and contrast because it is pigment based (as are ordinary printing inks). The light scattered from the electronic ink comes from a very thin layer of pigment close to the viewing surface. In this respect it resembles an ordinary, printed image. Also, electronic ink is easily viewed from a wide range of viewing angles in the same manner as a printed page, and such ink approximates a Lambertian contrast curve more closely than any other electronic display material. Since electronic ink can be printed, it can be included on the same surface with any other printed material, including traditional inks. Electronic ink can be made optically stable in all display configurations, that is, the ink can be set to a persistent optical state. Fabrication of a display by printing an electronic ink is particularly useful in low power applications because of this stability.

Electronic ink displays are novel in that they can be addressed by DC voltages and draw very little current. Therefore, elements forming electronic inks may be made of non-traditional materials and electronic inks may be manufactured by and used in non-traditional methods. As such, the conductive leads and electrodes used to deliver the voltage to electronic ink displays can be of relatively high resistivity. The ability to use resistive conductors substantially widens the number and type of materials that can be used as conductors in electronic ink displays. In particular, the use of costly vacuum-sputtered indium tin oxide (ITO) conductors, a standard material in liquid crystal devices, is not required. Aside from cost savings, the replacement of ITO with other materials can provide benefits in appearance, processing capabilities (printed conductors), flexibility, and durability. Additionally, the printed electrodes are in contact only with a solid binder, not with a fluid layer (like liquid crystals). This means that some conductive materials, which would otherwise dissolve or be degraded by contact with liquid crystals, can be used in an electronic ink application. These include opaque metallic inks for the rear electrode (e.g., silver and graphite inks), as well as conductive transparent inks for either substrate. These conductive coatings include semiconducting colloids, examples of which are indium tin oxide and antimony-doped tin oxide. Organic conductors (polymeric conductors and molecular organic conductors) also may be used. Polymers include, but are not limited to, polyaniline and derivatives, polythiophene and derivatives, poly3,4-ethylenedioxythiophene (PEDOT) and derivatives, polypyrrole and derivatives, and polyphenylenevinylene (PPV) and derivatives. Organic molecular conductors include, but are not limited to, derivatives of naphthalene, phthalocyanine, and pentacene. Polymer layers can be made thinner and more transparent than with traditional displays because conductivity requirements are not as stringent.

As an example, there is a class of materials called electroconductive powders which are also useful as coatable transparent conductors in electronic ink displays. One example is Zelec ECP electroconductive powders from DuPont Chemical Co. of Wilmington, Del.

It is possible to produce a wide gamut of colors from the superposition of suitable proportions of three properly chosen colors. In one embodiment, the colors red, green, and blue can be combined in various proportions to produce an image that is perceived as a selected color. Emissive or transmissive displays operate according to additive rules, where the perceived color is created by summing the emission wavelengths of a plurality of emitting or transmitting objects. For an emissive or transmissive display that includes three display elements, one of which can produce red light, one green light, and one blue light, respectively, one can generate a wide gamut of colors, as well as white and black. At one extreme, the combination of all three at full intensity is perceived as white, and at the other, the combination of all three at zero intensity is perceived as black. Specific combinations of controlled proportions of these three colors can be used to represent other colors.

In a reflective display, the light that a viewer perceives is the portion of the spectrum that is not absorbed when the light to be reflected falls on the reflector surface. One may thus consider a reflecting system as a subtractive system, that is, that each reflective surface "subtracts" from the light that portion which the reflector absorbs. The color of a reflector represents the wavelengths of light the reflector absorbs. A yellow reflector absorbs substantially blue light. A magenta reflector absorbs substantially green light. A cyan reflector absorbs substantially red light. Thus, in an alternative embodiment employing reflectors, nearly the same results as an emissive system can be obtained by use of the three colors cyan, yellow, and magenta as the primary colors, from which all other colors, including black but not white, can be derived. To obtain white from such a display, one must further introduce a third state per display element, namely white.

While the methods described discuss particles, any combination of dyes, liquids droplets and transparent regions that respond to electrophoretic effects could also be used. Particles of various optical effects may be combined in any suitable proportion. For example, certain colors may be over- or under-populated in the electrophoretic display, for example, by printing more display elements of one color than of another color, to account for the sensitivities of the human eye and to thereby achieve a more pleasing or uniform effect. Similarly, the sizes of the display elements may also be disproportionate to achieve various optical effects.

Although these examples describe microencapsulated electrophoretic displays, the invention can be utilized across other reflective displays including liquid crystal, polymer-dispersed liquid crystal, rotating ball, suspended particle and any other reflective display capable of being printed. In short, many schemes are possible by which display elements in a direct color reflective display can be printed. Such printing schemes will vary by the nature of the display and any suitable means may be used.

Figure 1B:
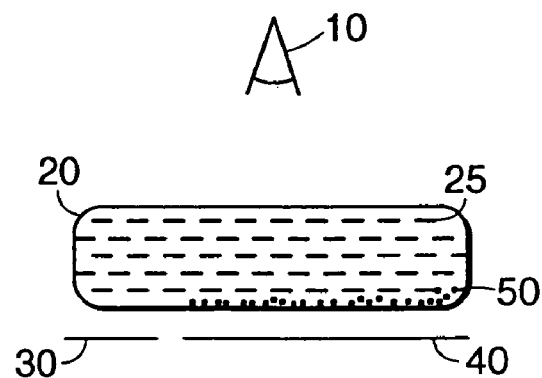
FIG. 1B is a diagrammatic side view of an embodiment of a rear-addressing electrode structure for a particle-based display in which the larger electrode has been placed at a voltage relative to the smaller electrode causing the particles to migrate to the larger electrode.

Referring now to FIGS. 1A and 1B, an addressing scheme for controlling particle-based displays is shown in which electrodes are disposed on only one side of a display, allowing the display to be rear-addressed. Utilizing only one side of the display for electrodes simplifies fabrication of displays. For example, if the electrodes are disposed on only the rear side of a display, both of the electrodes can be fabricated using opaque materials, which may be colored, because the electrodes do not need to be transparent.

FIG. 1A depicts a single capsule 20 of an encapsulated display media. In brief overview, the embodiment depicted in FIG. 1A includes a capsule 20 containing at least one particle 50 dispersed in a suspending fluid 25. The capsule 20 is addressed by a first electrode 30 and a second electrode 40. The first electrode 30 is smaller than the second electrode 40. The first electrode 30 and the second electrode 40 may be set to voltage potentials which affect the position of the particles 50 in the capsule 20.

The particles 50 represent 0.1% to 20% of the volume enclosed by the capsule 20. In some embodiments the particles 50 represent 2.5% to 17.5% of the volume enclosed by capsule 20. In preferred embodiments, the particles 50 represent 5% to 15% of the volume enclosed by the capsule 20. In more preferred embodiments the particles 50 represent 9% to 11% of the volume defined by the capsule 20. In general, the volume percentage of the capsule 20 that the particles 50 represent should be selected so that the particles 50 expose most of the second, larger electrode 40 when positioned over the first, smaller electrode 30. As described in detail below, the particles 50 may be colored any one of a number of colors. The particles 50 may be either positively charged or negatively charged.

The particles 50 are dispersed in a dispersing fluid 25. The dispersing fluid 25 should have a low dielectric constant. The fluid 25 may be clear, or substantially clear, so that the fluid 25 does not inhibit viewing the particles 50 and the electrodes 30, 40 from position 10. In other embodiments, the fluid 25 is dyed. In some embodiments the dispersing fluid 25 has a specific gravity substantially matched to the density of the particles 50. These embodiments can provide a bistable display media, because the particles 50 do not tend to move absent an electric field applied via the electrodes 30, 40.

Figure 1C:
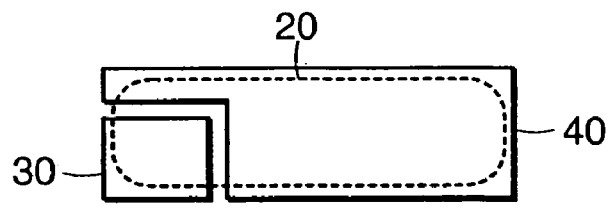
FIG. 1C is a diagrammatic top-down view of one embodiment of a rear-addressing electrode structure.

The electrodes 30, 40 should be sized and positioned appropriately so that together they address the entire capsule 20. There may be exactly one pair of electrodes 30, 40 per capsule 20, multiple pairs of electrodes 30, 40 per capsule 20, or a single pair of electrodes 30, 40 may span multiple capsules 20. In the embodiment shown in FIGS. 1A and 1B, the capsule 20 has a flattened, rectangular shape. In these embodiments, the electrodes 30, 40 should address most, or all, of the flattened surface area adjacent the electrodes 30, 40. The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40. It should be noted that reference to "smaller" in connection with the electrode 30 means that the electrode 30 addresses a smaller amount of the surface area of the capsule 20, not necessarily that the electrode 30 is physically smaller than the larger electrode 40. For example, multiple capsules 20 may be positioned such that less of each capsule 20 is addressed by the "smaller" electrode 30, even though both electrodes 30, 40 ate equal in size. It should also be noted that, as shown in FIG. 1C, electrode 30 may address only a small corner of a rectangular capsule 20 (shown in phantom view in FIG. 1C), requiring the larger electrode 40 to surround the smaller electrode 30 on two sides in order to properly address the capsule 20. Further, electrodes may be of any shape, such as concentric rings or rectangles. Selection of the percentage volume of the particles 50 and the electrodes 30, 40 in this manner allow the encapsulated display media to be addressed as described below.

Electrodes generally may be fabricated from any material capable of conducting electricity so that electrode 30, 40 may apply an electric field to the capsule 20. In the embodiments to be discussed here, conductive material may be printed by using conductive ink. Conductive inks are well known and may be prepared by including in the ink fluid a conductive material such as powdered metal or powdered graphite. As noted above, the rear-addressed embodiments depicted in FIGS. 1A and 1B allow the electrodes 30, 40 to be fabricated from opaque materials such as solder paste, copper, copper-clad polyimide, graphite inks, silver inks and other metal-containing conductive inks. Alternatively, electrodes may be fabricated using transparent materials such as indium tin oxide and conductive polymers such as polyaniline or polythiopenes. Electrodes 30, 40 may be provided with contrasting optical properties. In some embodiments, one of the, electrodes has an optical property complementary to optical properties of the particles 50. Alternatively, since the electrodes need not be transparent, an electrode can be constructed so as to display a selected color. Since electric current is not always required to be conducted from an electrode to a display element, but is only required to flow within the electrode to set up an electric field, one is in general able to overcoat the electrode with a colored ink so as to impart a desired color to an electrode, without detrimental effect on the operation of an electrode.

The operation of the electrophoretic display element will be presented with regard to an embodiment that displays two states, for example, black and white. In this embodiment, the capsule 20 contains positively charged black particles 50, and a substantially clear suspending fluid 25. The first, smaller electrode 30 is colored black, and is smaller than the second electrode 40, which is colored white or is highly reflective. When the smaller, black electrode 30 is placed at a negative voltage potential relative to larger, white electrode 40, the positively-charged particles 50 migrate to the smaller, black electrode 30. The effect to a viewer of the capsule 20 located at position 10 is a mixture of the larger, white electrode 40 and the smaller, black electrode 30, creating an effect which is largely white. Referring to FIG. 1B, when the smaller, black electrode 30 is placed at a positive voltage potential relative to the larger, white electrode 40, particles 50 migrate to the larger, white electrode 40 and the viewer is presented a mixture of the black particles 50 covering the larger, white electrode 40 and the smaller, black electrode 30, creating an effect which is largely black. In this manner the capsule 20 may be addressed to display either a white visual state or a black visual state.

Other two-color schemes are easily provided by varying the color of the smaller electrode 30 and the particles 50 or by varying the color of the larger electrode 40. For example, varying the color of the larger electrode 40 allows fabrication of a rear-addressed, two-color display having black as one of the colors. Alternatively, varying the color of the smaller electrode 30 and the particles 50 allow a rear-addressed two-color system to be fabricated using white as one of the colors. Further, it is contemplated that the particles 50 and the smaller electrode 30 can be different colors. In these embodiments, a two-color display may be fabricated having a second color that is different from the color of the smaller electrode 30 and the particles 50. For example, a rear-addressed, orange-white display may be fabricated by providing blue particles 50, a red, smaller electrode 30, and a white (or highly reflective) larger electrode 40. In general, the optical properties of the electrodes 30, 40 and the particles 50 can be independently selected to provide desired display characteristics. In some embodiments the optical properties of the dispersing fluid 25 may also be varied, e.g. the fluid 25 may be dyed.

Figure 1D:
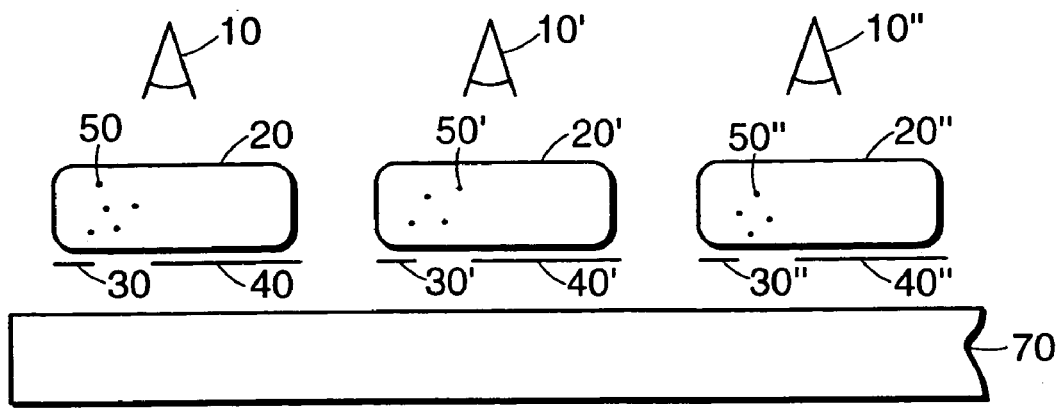
FIG. 1D is a diagrammatic side view of one embodiment of a display having three display elements, each display element being produced by a printing process.
Figure 1E:
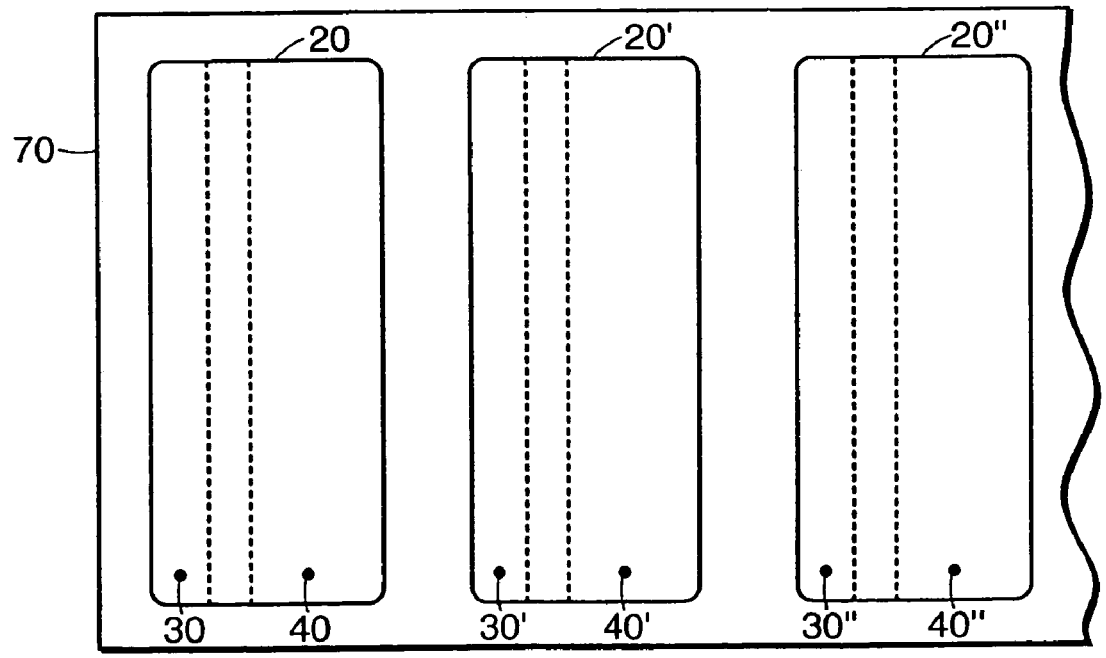
FIG. 1E is a diagrammatic plan view of one embodiment of a display having three display elements, each display element being produced by a printing process.
Figure 2:
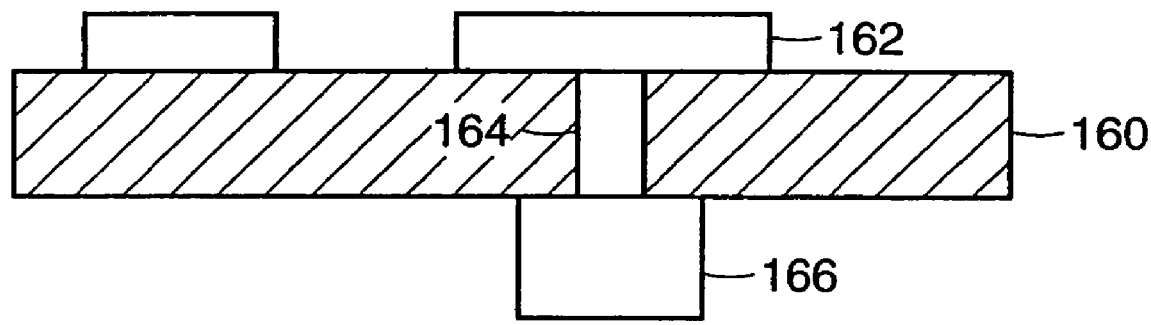
FIG. 2 is a cross-sectional view of a rear electrode addressing structure that is formed by printing.

In another embodiment, this technique may be used to provide a full color display. Referring now to FIGS. 1D and 1E, an embodiment is depicted that comprises three display elements. It should be understood that although FIGS. 1D and 1E depict rectangular elements having equally-sized display elements, an element may have any shape and a display may be comprised of display elements that are unequal in size or shape, or alternatively the display may be comprised of display elements that are unequal in number by color or optical property. The display elements may each be formed as a single large capsule, or each may be distributed across any number of small capsules or cells. For the purposes of illustration, the simpler case of a single large capsule for each display element is shown. In both cases we refer to the regions 20, 20', 20", as capsules. Thus, a first capsule 20 contains positively charged black particles 50 and a substantially clear suspending fluid 25. A first, smaller electrode 30 is colored black, and is smaller than the second electrode 40, which is colored red. When the smaller, black electrode 30 is placed at a negative voltage potential relative to larger, red electrode 40, the positively-charged particles 50 migrate to the smaller, black electrode 30. The effect to a viewer of the capsule 20 located at position 10 is a mixture of the larger, red electrode 40 and the smaller, black electrode 30, creating an effect which is largely red. When the smaller, black electrode 30 is placed at a positive voltage potential relative to the larger, red electrode 40, particles 50 migrate to the larger, red electrode 40 and the viewer is presented a mixture of the black particles 50 covering the larger, red electrode 40 and the smaller, black electrode 30, creating an effect which is largely black. In this manner the first capsule 20 may be addressed to display either a red visual state or a black visual state. One can equally have a second capsule 20' wherein the larger electrode 40' is green, and a third capsule 20" wherein the larger electrode 40" is blue. A second capsule 20' contains positively charged black particles 50' and a substantially clear suspending fluid 25'. A first, smaller electrode 30' is colored black, and is smaller than the second electrode 40', which is colored green. When the smaller, black electrode 30' is placed at a negative voltage potential relative to larger, green electrode 40', the positively-charged particles 50' migrate to the smaller, black electrode 30'. The effect to a viewer of the capsule 20' located at position 10' is a mixture of the larger, green electrode 40' and the smaller, black electrode 30', creating an effect which is largely green. When the smaller, black electrode 30' is placed at a positive voltage potential relative to the larger, green electrode 40', particles 50' migrate to the larger, green electrode 40' and the viewer is presented a mixture of the black particles 50' covering the larger, green electrode 40' and the smaller, black electrode 30', creating an effect which is largely black. Similarly, a third capsule 20" contains positively charged black particles 50" and a substantially, clear suspending fluid 25". A first, smaller electrode 30" is colored black, and is smaller than the second electrode 40", which-is colored blue. When the smaller, black electrode 30" is placed at a negative voltage potential relative to larger, blue electrode 40", the positively-charged particles 50" migrate to the smaller, black electrode 30". The effect to a viewer of the capsule 20" located at position 10" is a mixture of the larger, blue electrode 40" and the smaller, black electrode 30", creating an effect which is largely blue. When the smaller, black electrode 30" is placed at a positive voltage potential relative to the larger, blue electrode 40", particles 50" migrate to the larger, blue electrode 40" and the viewer is presented a mixture of the black particles 50" covering the larger, blue electrode 40" and the smaller, black electrode 30", creating an effect which is largely black. Further, the relative intensities of these colors can be controlled by the actual voltage potentials applied to the electrodes. By choosing appropriate combinations of the three colors, one may create a visual display which appears as the effective combination of the selected colors as an additive process. As an alternative embodiment, the first, second and third capsules can have larger electrodes 40, 40', 40" which are respectively colored cyan, yellow, and magenta. Operation of the alternative cyan, yellow, and magenta embodiment is analogous to that of the red, green, and blue embodiment, with the feature that the color to be displayed is selected by a subtractive process.

In other embodiments the larger electrode 40 may be transparent or reflective instead of white. In these embodiments, when the particles 50 are moved to the smaller electrode 30, light reflects off the reflective surface of the larger electrode 40 and the capsule 20 appears light in color, e.g. white. When the particles 50 are moved to the larger electrode 40, the reflecting surface is obscured and the capsule 20 appears dark because light is absorbed by the particles 50 before reaching the reflecting surface. In other embodiments, proper switching of the particles may be accomplished with a combination of alternating-current (AC) and direct-current (DC) electric fields.

In still other embodiments, the rear-addressed display previously discussed can be configured to transition between largely transmissive and largely opaque modes of operation (referred to hereafter as "shutter mode"). Referring back to FIGS. 1A and 1B, in these embodiments the capsule 20 contains at least one positively-charged particle 50 dispersed in a substantially clear dispersing fluid 25. The larger electrode 40 is transparent and the smaller electrode 30 is opaque. When the smaller, opaque electrode 30 is placed at a negative voltage potential relative to the larger, transmissive electrode 40, the particles 50 migrate to the smaller, opaque electrode 30. The effect to a viewer of the capsule 20 located at position 10 is a mixture of the larger, transparent electrode 40 and the smaller, opaque electrode 30, creating an effect which is largely transparent. Referring to FIG. 1B, when the smaller, opaque electrode 30 is placed at a positive voltage potential relative to the larger, transparent electrode 40, particles 50 migrate to the second electrode 40 and the viewer is presented a mixture of the opaque particles 50 covering the larger, transparent electrode 40 and the smaller, opaque electrode 30, creating an effect which is largely opaque. In this manner, a display formed using the capsules depicted in FIGS. 1A and 1B may be switched between transmissive and opaque modes. In some embodiments the electrodes may be disposed on the viewing side of the capsule 20. Such a display can be used to construct a window that can be rendered opaque or a wide range of colors by using a tinted electrode. Although FIGS. 1A-1D depict a pair of electrodes associated with each capsule 20, it should be understood that each pair of electrodes may be associated with more than one capsule 20.

Figure 3A:
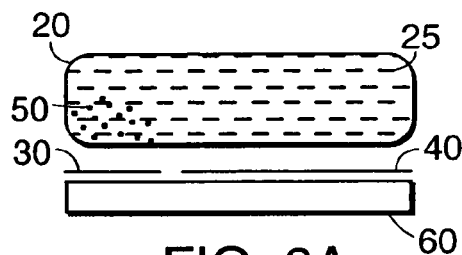
FIG. 3A is a diagrammatic side view of an embodiment of an addressing structure having an opaque electrode and a transparent electrode, in which a direct-current electric field has been applied to the capsule causing the particles to migrate towards an electrode.

A similar technique may be used in connection with the embodiment of FIGS. 3A, 3B, 3C, and 3D. Referring to FIG. 3A, a capsule 20 contains at least one dark or black particle 50 dispersed in a substantially clear dispersing fluid 25. A smaller, opaque electrode 30 and a larger, transparent electrode 40 apply both direct-current (DC) electric fields and alternating-current (AC) fields to the capsule 20. A DC field can be applied to the capsule 20 to cause the particles 50 to migrate towards the smaller electrode 30. For example, if the particles 50 are positively charged, the smaller electrode is placed a voltage that is more negative than the larger electrode 40. Although FIGS. 3A-3D depict only one capsule per electrode pair, multiple capsules may be addressed using the same electrode pair.

The smaller electrode 30 is at most one-half the size of the larger electrode 40. In preferred embodiments the smaller electrode is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40.

Causing the particles 50 to migrate to the smaller electrode 30, as depicted in FIG. 3A, allows incident light to pass through the larger, transparent electrode 40 and be reflected by a reflecting surface 60. In shutter mode, the reflecting surface 60 is replaced by a translucent layer, a transparent layer, or a layer is not provided at all, and incident light is allowed to pass through the capsule 20, i.e. the capsule 20 is transmissive. If the translucent layer or the transparent layer comprises a color, such as a color filter, the light that is transmitted will be those wavelengths that the filter passes, and the reflected light will consist of those wavelengths that the filter reflects, while the wavelengths that the filter absorbs will be lost. The visual appearance of a shutter mode display may thus depend on whether the display is in a transmissive or reflective condition, on the characteristics of the filter, and on the position of the viewer.

Figure 3B:
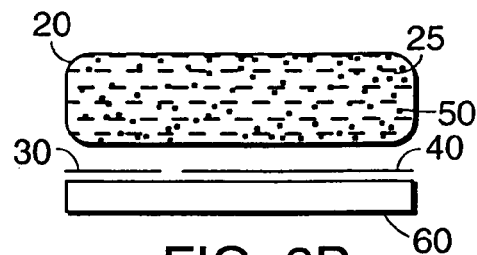
FIG. 3B is a diagrammatic side view of an embodiment of an addressing structure having an opaque electrode and a transparent electrode, in which an alternating-current electric field has been applied to the capsule causing the particles to disperse into the capsule.

Referring now to FIG. 3B, the particles 50 are dispersed throughout the capsule 20 by applying an AC field to the capsule 20 via the electrodes 30, 40. The particles 50, dispersed into the capsule 20 by the AC field, block incident light from passing through the capsule 20, causing it to appear dark at the viewpoint 10. The embodiment depicted in FIGS. 3A-3B may be used in shutter mode by not providing the reflecting surface 60 and instead providing a translucent layer, a transparent layer, a color filter layer, or no layer at all. In shutter mode, application of an AC electric field causes the capsule 20 to appear opaque. The transparency of a shutter mode display formed by the apparatus depicted in FIGS. 3A-3D may be controlled by the number of capsules addressed using DC fields and AC fields. For example, a display in which every other capsule 20 is addressed using an AC field would appear about half as transmissive as when the particles are all addressed by the AC field.

Figure 3C:
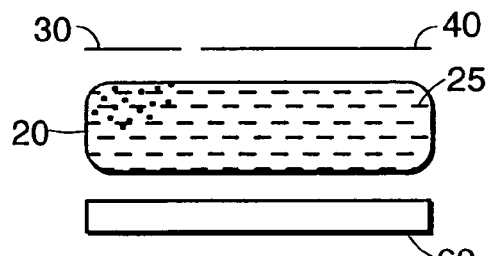
FIG. 3C is a diagrammatic side view of an embodiment of an addressing structure having transparent electrodes, in which a direct-current electric field has been applied to the capsule causing the particles to migrate towards an electrode.
Figure 3D:
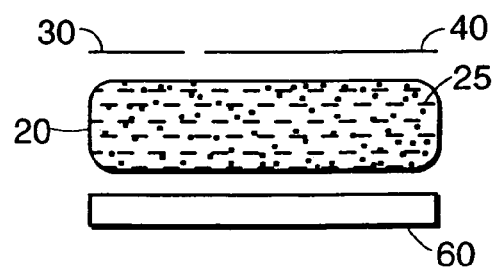
FIG. 3D is a diagrammatic side view of an embodiment of an addressing structure having transparent electrodes, in which an alternating-current electric field has been applied to the capsule causing the particles to disperse into the capsule.

FIGS. 3C and 3D depict an embodiment of the electrode structure described above in which electrodes 30, 40 are on "top" of the capsule 20, that is, the electrodes 30, 40 are between the viewpoint 10 and the capsule 20. In these embodiments, both electrodes 30, 40 should be transparent. Transparent conducting layers can be fabricated using conductive polymers, such as polyaniline, polythiophenes, indium tin oxide, or polymers containing conducting particles lass than 100 nanometers in diameter such as copper iodide, ionic polymers, or slat-doped polymers. These materials may be made soluble so that electrodes can be fabricated using coating techniques such as spin coating, spray coating, meniscus coating, printing techniques, forward and reverse roll coating and the like. In these embodiments, light passes through the electrodes 30, 40 and is either absorbed by the particles 50, reflected by reflecting layer 60 (when provided), transmitted throughout the capsule 20 (when reflecting layer 60 is not provided), or partially transmitted and/or reflected if a color filter is present in place of retroreflecting layer 60.

Figure 3E:
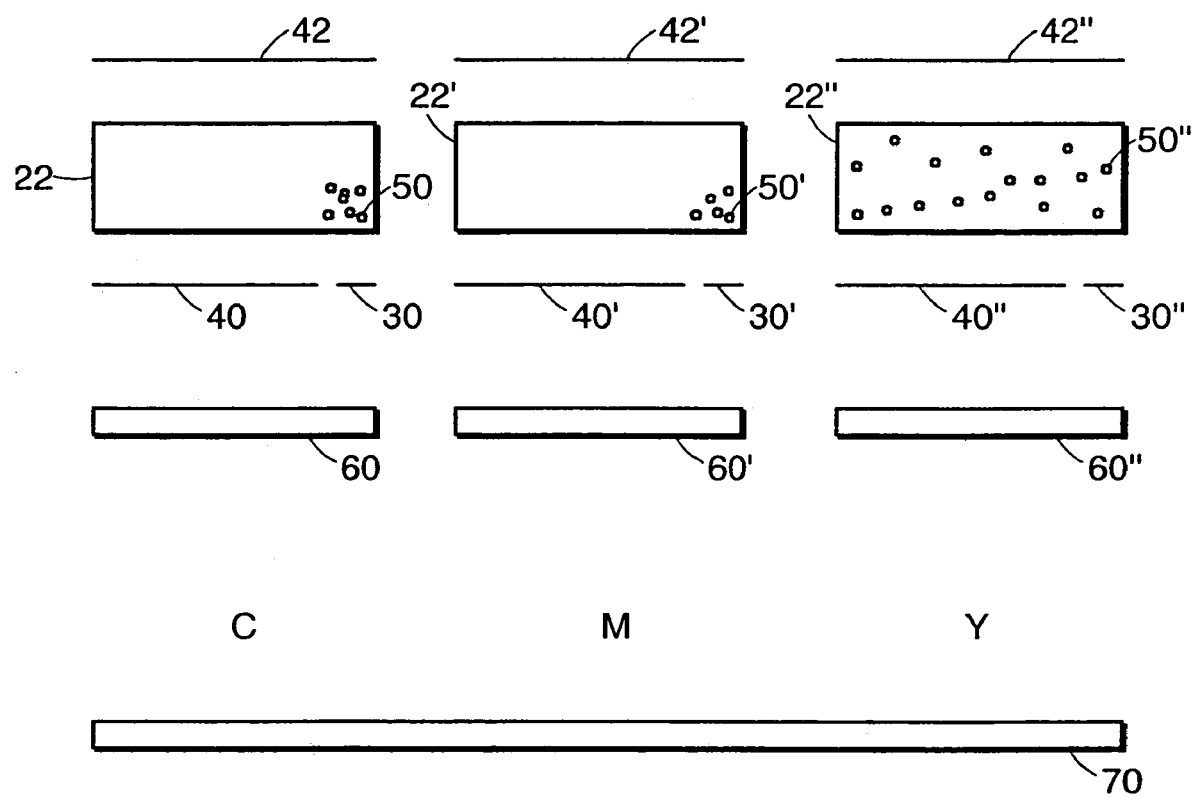
FIG. 3E is a diagrammatic side view of an embodiment of an addressing structure for a display element having three sub-pixels.

Referring to FIG. 3E, three display element capsules 22, 22' and 22" each contain at least one white particle 50 dispersed in a substantially clear dispersing fluid 25. In one embodiment, each display element capsule 22, 22' and 22" has a transparent electrode 42, 42', and 42" disposed above it and a colored filter 60, 60' and 60" disposed below it. A common reflective surface 70 may be shared behind the color filter layer. In an alternative embodiment, the display includes an emissive light source 70. Smaller, opaque electrodes 30, 30' and 30" and larger, transparent electrodes 40, 40' and 40"

may apply direct-current (DC) electric fields and alternating-current (AC) fields to the capsules 20, 20' and 20". A DC field can be applied to the capsules 20, 20' and 20" to cause the particles 50, 50' 50" to migrate towards the smaller electrodes 30, 30' and 30". For example, if the particles 50, 50' and 50" are positively charged, the smaller electrodes 30, 30' and 30" are placed a voltage that is more negative than the larger electrodes 40, 40' and 40".

The smaller electrode 30 is at most one-half the size of the larger electrode 40. In preferred embodiments the smaller electrode 30 is one-quarter the size of the larger electrode 40; in more preferred embodiments the smaller electrode 30 is one-eighth the size of the larger electrode 40. In even more preferred embodiments, the smaller electrode 30 is one-sixteenth the size of the larger electrode 40.

Causing the particles 50 to migrate to the smaller electrode 30, as depicted in the first two capsules of FIG. 3E, allows incident light to pass through the larger, transparent electrode 40, through filter 60, reflect off substrate 70 and pass back through the device. If the first, second and third filters 60, 60' and 60" are colored cyan, magenta, and yellow respectively, and the particles 50 are white, this system can display full color in a standard-two-color fashion.

The filter layer 60 may be a translucent layer, a transparent layer, a color filter layer, or a layer is not provided at all, and further substrate 70 may be reflective, emissive, translucent or not provided at all. If the layer 60 comprises a color, such as a color filter, the light which is transmitted will be those wavelengths that the filter passes, and the-reflected light Will consist of those wavelengths that the filter reflects, while the wavelengths that the filter absorbs will be lost. The visual appearance of a the display element in 3E may thus depend on whether the display is in a transmissive or reflective condition, on the characteristics of the filter; and on the position of the viewer. In an alternative embodiment layer 60 may be provided on top of the capsule adjacent to electrode 42.

Figure 3F:
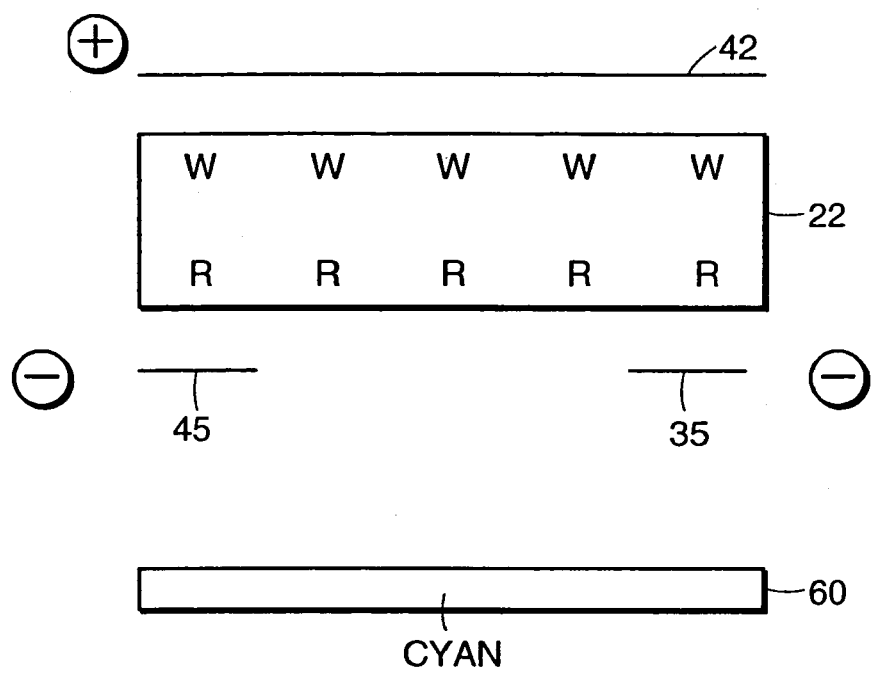
FIG. 3F is a diagrammatic side view of an embodiment of a dual particle curtain mode addressing structure addressing a display element to appear white.
Figure 3G:
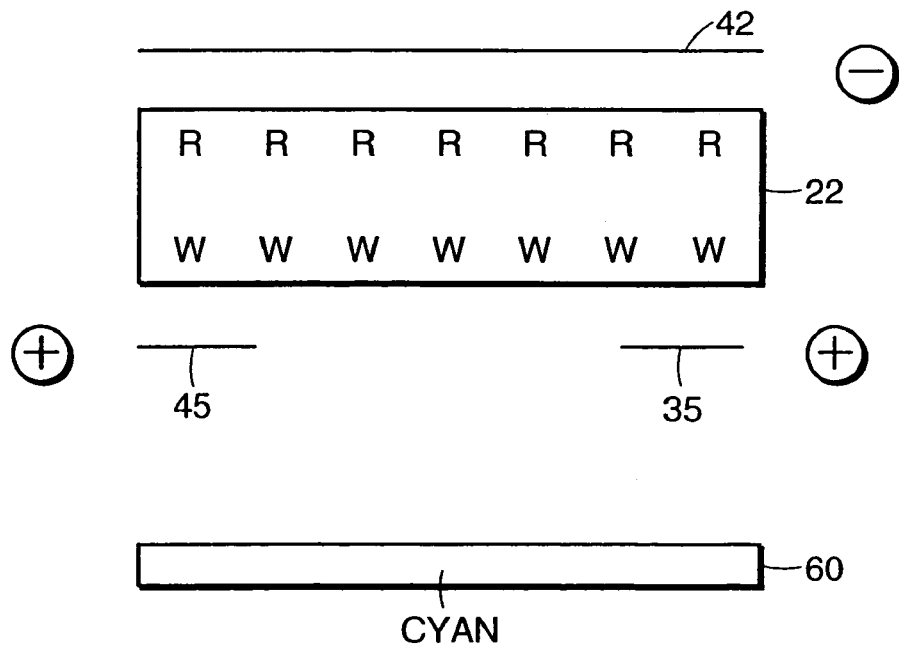
FIG. 3G is a diagrammatic side view of an embodiment of a dual particle curtain mode addressing structure addressing a display element to appear red.
Figure 3H:
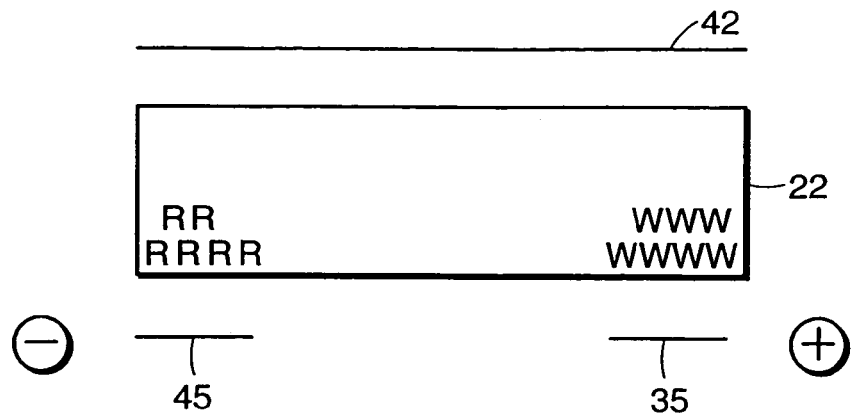
FIG. 3H is a diagrammatic side view of an embodiment of a dual particle curtain mode addressing structure addressing a display element to absorb red light.

Referring now to FIGS. 3F-3K, one embodiment of a tri-color element is described. Clear electrode 42 allows light to pass into capsule 22 and to strike either white particles W, red particles R, or a colored substrate 60. The substrate 60 can be a combination of color filter and non-colored substrate or it can be provided as a unitary colored substrate. Capsule 22 also includes a suspending fluid that can be dye-colored (possibly eliminating the need for a separate color filter 60) or substantially clear. Electrodes 45 and 35 are transparent and may be equally sized or sized in any suitable manner taking into account the relative particles sizes and mobilities of particles W and R. A gap exists between 45 and 35. Assume that particles W are negatively charged and particles R are positively charged. In FIG. 3F, top electrode 42 is set at a positive voltage potential relative to bottom electrodes 35 and 45, moving particles W to the top and particles R to the bottom and thus white is displayed. In FIG. 3G by reversing the polarity of the electrodes, red is displayed. In both FIGS. 3F and 3G the particles obscure substrate 60. In FIG. 3H electrode 45 is at a negative voltage potential relative to electrode 35, while electrode 42 is at a voltage potential between the potentials of 45 and 35, such as zero. Alternatively, electrode 42 switches between the potentials of 45 and 35 so that over time the effective voltage of 42 is again between the potentials of 45 and 35. In this state, the particles R move toward electrode 45 and the particles W move toward electrode 35 and both particles R and W move away from the gap in the center of the capsule 22. This reveals substrate 60, permitting a third color such as cyan to be imaged. In alternate embodiments the color combinations can differ. The specific colors of the filters and particles need not differ. This system, called "dual particle curtain mode," can image three arbitrary colors. In a preferred embodiment the colors are as described wherein one color is white and the other two colors are complements. In this manner, referring again to FIG. 3H, if a small portion of red is visible it absorbs part of the light reflected from the cyan substrate and the net result is black, which may be offset by a small portion of visible white. Thus, the element in FIG. 3H may appear to be cyan even if some red and white is visible. As mentioned above, the edges of the element may be masked to hide particles R and W when in the mode shown in FIG. 3H.

Figure 3I:
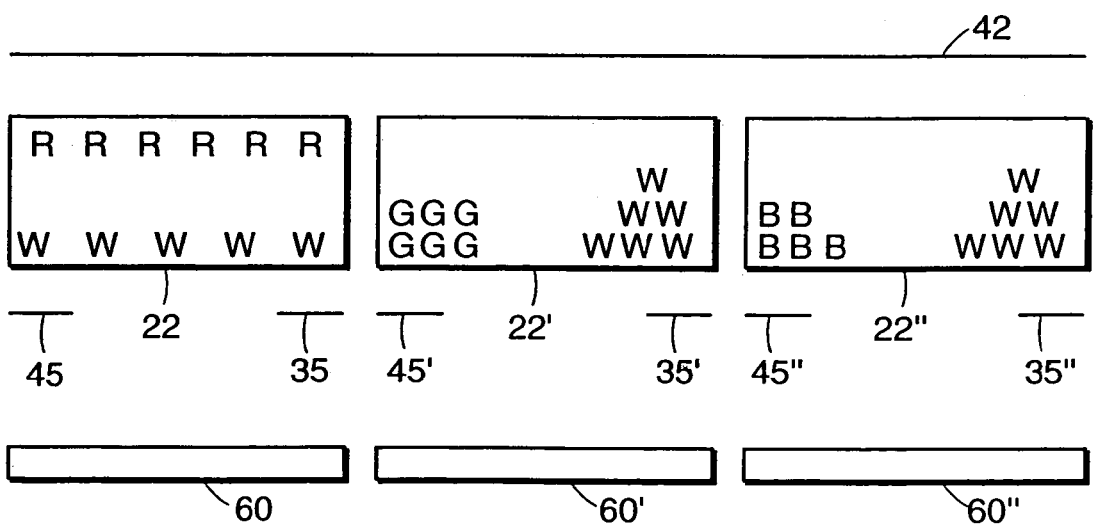
FIG. 3I is a diagrammatic side view of an embodiment of a dual particle curtain mode addressing structure for a display element having three sub-pixels, in which the display is addressed to appear red.

Referring now to FIG. 3I, a full-color element is shown comprising three display elements, each operating in the manner taught by FIGS. 3F-3H wherein the colored particles are positively charged, and the white particles are negatively charged. The system may still function with top electrode 42 extended as a common top electrode as shown in FIG. 3I. For example, to achieve the state shown, electrodes 42, 45, 35, 45', 35', 45", 35" may be set to voltage potentials −30V, 60V, 60V, −60V, +60V, −60V, +60V respectively.

Figure 3J:
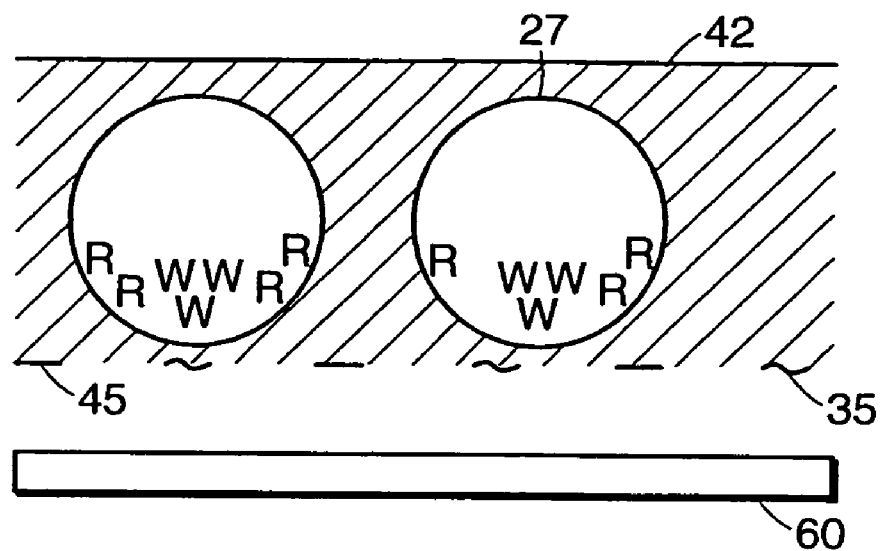
FIG. 3J is a diagrammatic side view of another embodiment of a dual particle curtain mode addressing structure for a display element.
Figure 3K:
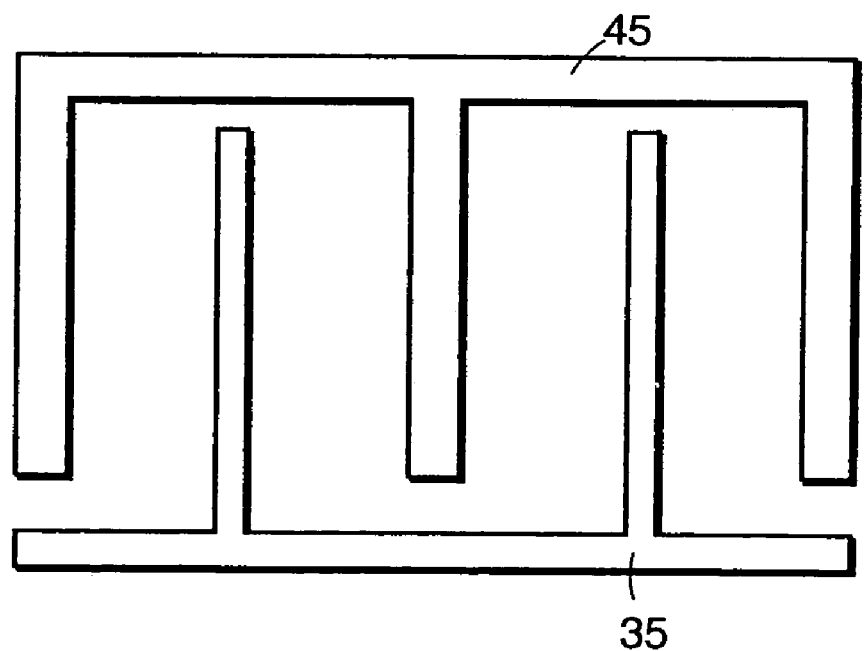
FIG. 3K is a diagrammatic plan view of an embodiment of an interdigitated electrode structure.

Referring now to FIGS. 3J-3K, an electrode scheme is shown whereby a cluster of microcapsules may be addressed for an entire display element in a manner similar to those described above. Clear electrode 42 allows light to pass into microcapsules 27 and to strike either white particles W, red particles R, or colored substrate 60. As above, colored substrate 60 may be a combination of color filter and non-colored substrate 60 or colored substrate 60 may be provided as a unitary colored substrate. Capsules 27 include a suspending fluid that may be dye-colored (possibly eliminating the need for a separate color filter 60) or substantially clear. Electrodes 45 and 35 are transparent and may be equally sized or sized in any suitable manner taking into account the relative particle sizes and mobilities of particles W and R. A gap exists between 45 and 35. Assume that particles W are negatively charged and particles R are positively charged. The system operates in the manner described in FIGS. 3F-3K, although for any given microcapsule 27 there may be multiple gaps. FIG. 3K illustrates an embodiment of a suitable electrode pattern in which 45 and 35 are interdigitated.

Figure 3L:
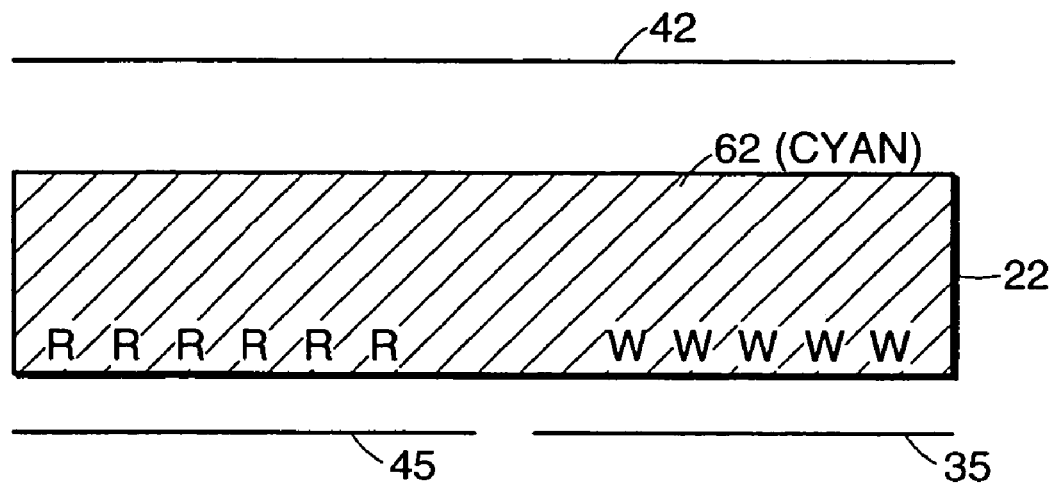
FIG. 3L is a diagrammatic side view of another embodiment of a dual particle curtain mode display structure having a dyed fluid and two species of particles, addressed to absorb red.
Figure 3M:
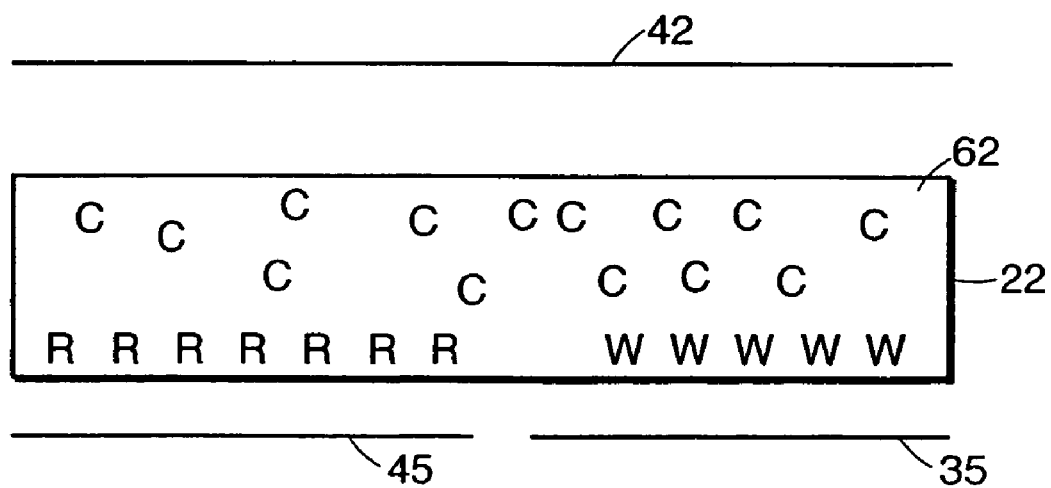
FIG. 3M is a diagrammatic side view of another embodiment of a dual particle curtain mode display structure having clear fluid and three species of particles, addressed to absorb red.

Referring now to 3L-3M, an alternate embodiment is shown. Again clear electrode 42 allows light to pass into capsule 22 and to strike white particles W or red particles R. In the embodiment shown in FIG. 3L, capsule 22 includes a suspending fluid 62 that is dyed cyan. When electrodes 45 and 35 are set at appropriate voltages particles, R and W move down to electrodes 45 and 35 respectively, where they are obscured by light-absorbing suspending fluid 62. Alternatively, as shown in FIG. 3M, suspending fluid 62 is substantially clear and a third species of cyan particles C is included in capsules 22. The cyan particles have a relatively neutral charge. When electrodes 45 and 35 are set at appropriate voltages particles R and W move down to electrodes 45 and 35 respectively, revealing the cyan particles.

The addressing structure depicted in FIGS. 3A-3M may be used with electrophoretic display media and encapsulated electrophoretic display media. FIGS. 3A-3M depict embodiments in which electrode 30, 40 are statically attached to the display media. In certain embodiments, the particles 50 exhibit bistability, that is, they are substantially motionless in the absence of a electric field.

While various of the substrates described above are reflective, an analogous technique may be employed wherein the substrates emit light, with the particles again acting in a "shutter mode" to reveal or obscure light. A preferred substrate for this use is an electroluminescent (EL) backlight. Such a backlight can be reflective when inactive, often with a whitish-green color, yet emit lights in various wavelengths when active. By using whitish EL substrates in place of static white reflective substrates, it is possible to construct a full-color reflective display that can also switch its mode of operation to display a range of colors in an emissive state, permitting operation in low ambient light conditions.

Figure 4A:
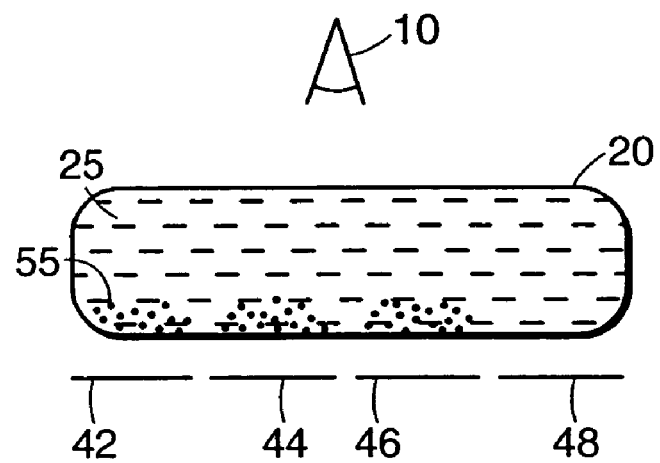
FIG. 4A is a diagrammatic side view of an embodiment of a rear-addressing electrode structure having colored electrodes and a white electrode, in which the colored electrodes have been placed at a high voltage relative to the white electrode causing the particles to migrate to the colored electrodes.
Figure 4B:
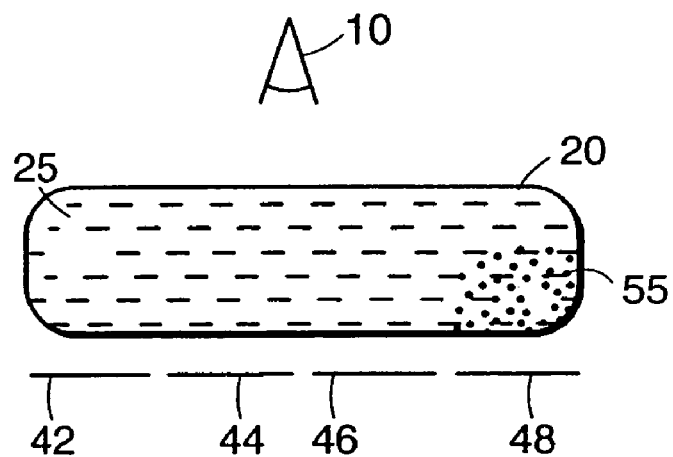
FIG. 4B is a diagrammatic side view of an embodiment of a rear-addressing electrode structure having colored electrodes and a white electrode, in which the white electrode has been placed at a high voltage relative to the colored electrodes causing the particles to migrate to the white electrode.

FIGS. 4A and 4B depict an embodiment of a rear-addressing electrode structure that creates a reflective color display in a manner similar to halftoning or pointillism. The capsule 20 contains white particles 55 dispersed in a clear suspending fluid 25. Electrodes 42, 44, 46, 48 are colored cyan, magenta, yellow, and white respectively. Referring to FIG. 4A, when the colored electrodes 42, 44, 46 are placed at a positive potential relative to the white electrode 48, negatively-charged particles 55 migrate to these three electrodes, causing the capsule 20 to present to the viewpoint 10 a mix of the white particles 55 and the white electrode 48, creating an effect which is largely white. Referring to FIG. 4B, when electrodes 42, 44, 46 are placed at a negative potential relative to electrode 48, particles 55 migrate to the white electrode 48, and the eye 10 sees a mix of the white particles 55, the cyan electrode 42, the magenta electrode 44, and the yellow electrode 46, creating an effect which is largely black or gray. By addressing the electrodes, any color can be produced that is possible with a subtractive color process. For example, to cause the capsule 20 to display a red color to the viewpoint 10, the yellow electrode 46 and the magenta electrode 42 are set to a voltage-potential that is more positive than the voltage potential applied by the cyan electrode 42 and the white electrode 48. Further, the relative intensities of these colors can be controlled by the actual voltage potentials applied to the electrodes. Again, AC current may be used appropriately to randomize the position of the particles as a step in this process.

The technique used in FIGS. 4A and 4B could be used in a similar manner with fewer electrodes and controlling fewer colors. For example, if electrode 42 were not present, the element could still display three colors. If electrodes 44 and 46 were colored red and cyan respectively, the capsule could display red, cyan and white. This construction could be used then employed as a display element, to be matched with similar display elements displaying other trios of colors thus achieving a full-color display as described above.

The addressing structures described in FIGS. 1-4B typically comprise a top electrode controlled by display driver circuitry. It may be seen that if the top electrode is absent, the display may be imaged by an externally applied voltage source, such as a passing stylus or electrostatic print head. The means that techniques applied above to generate a full-color electrophoretic display could also be applied for a full-color electrophoretic media.

Figure 5:
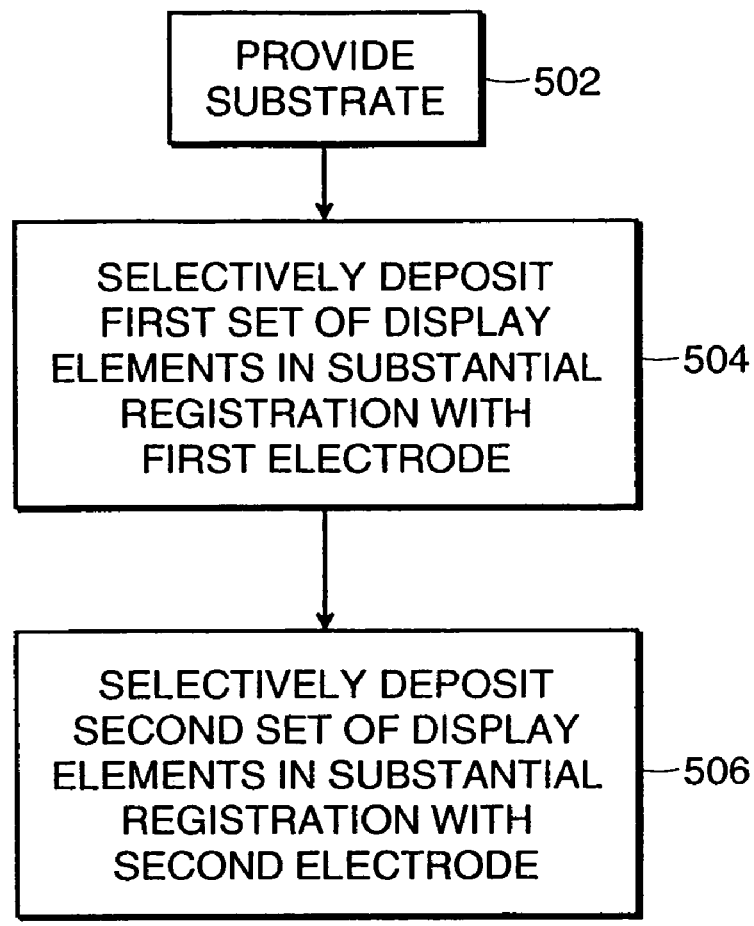
FIG. 5 is a flowchart showing the steps to be taken to fabricate a display using a method of the present invention.

As will be evident from the above discussion, color electrophoretic displays require careful registration of display elements to the electrodes used to address those display elements. Referring now to FIG. 5, steps that may be taken to efficiently and cheaply manufacture a display while avoiding the registration problems of prior art display are shown.

A substrate is provided that has at least two electrodes (step 502). The number of electrodes provided will vary depending on the number of regions to be individually addressed. For example, in a traditional RGB display, three electrodes or sets of electrodes may be provided in order to address red capsules, green capsules, and blue capsules. The electrodes may have a predetermined pattern of interest. For example, a display may include both electronic ink and traditional, printed inks. In such a display, the electrodes may be patterned to address only those portions of the display meant to bear electronic ink.

Figure 6:
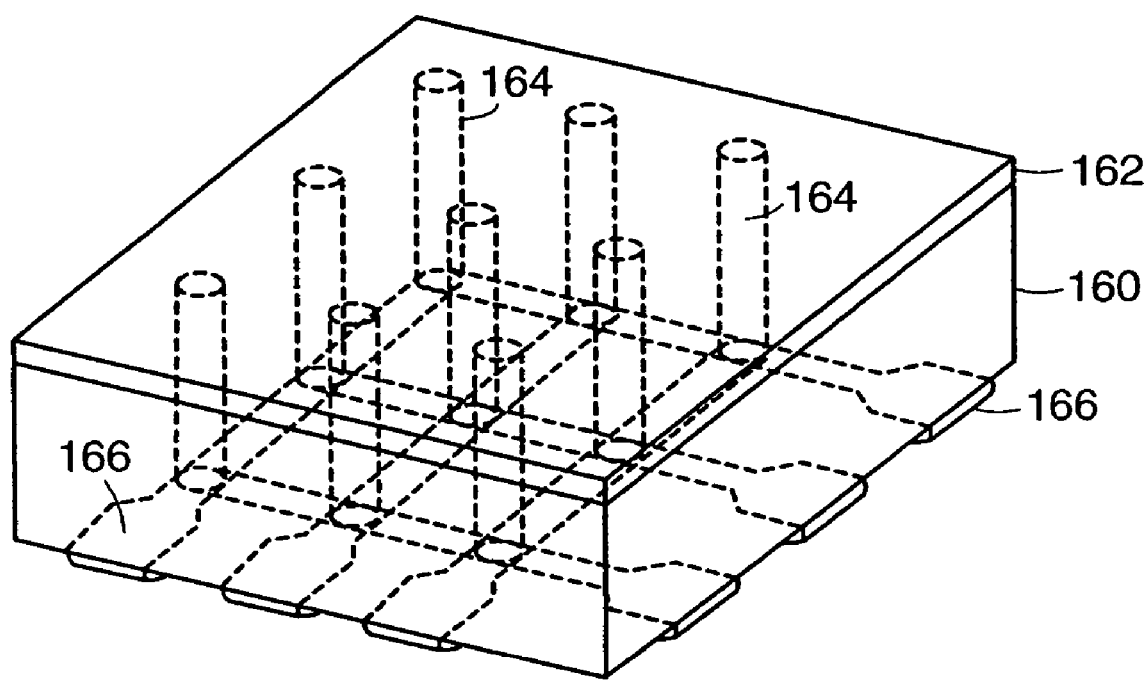
FIG. 6 is a three-quarter view of a printed electrode incorporating vias.

In some embodiments, the substrate is provided and the electrodes are printed on the substrate using any one of a number of printing techniques. Referring now to FIG. 6, the structure of a printed electrode is shown. A conductive material 162 can be printed onto an insulative substrate 160. In some embodiments, such as the one shown in FIG. 6, the substrate 160 defines one or more vias 164 that allow the printed conductive material 162 to be driven by addressing logic 166. The addressing logic 166 may also be printed.

Referring back to FIG. 5, a first plurality of electrophoretic display elements is selectively printed on the substrate in substantial registration with at least one of the electrodes disposed on the substrate (step 504). The electrophoretic display elements generally are capsules containing one or more species of particles in a dispersing fluid as described above in connection with FIGS. 1-4B. The display elements, which may form the contrast phase of an electronic ink, may be printed onto the substrate using any of the printing techniques described above. In certain embodiments, the printing technique itself provides the accuracy necessary to register the display elements to the appropriate electrode. For example, an ink-jet printing process could be used to print red capsules in substantial registration with a "red" electrode, green capsules in substantial registration with a "green" electrode, and blue capsules in substantial registration with a "blue" electrode. The capsules can be printed sequentially or ink-jet head may be used that allows red, green, and blue capsules to be simultaneously printed in a selective fashion.

In some embodiments, the display elements may be coated onto the substrate using an intermediate having a substantially cylindrical surface or a substantially flat surface, such as a lithographic belt. In specific embodiments, the intermediate is a roller, belt, blotter, brush, or sponge. The display elements may be held to the intermediate by electrostatic forces, surface tension, chemical bonding forces, or an applied electric field.

The properties of the binder phase. An be adjusted to match the desired printing process. For example, an ink to be used in inkjet printing may be adjusted to have a low viscosity. An ink suitable for lithographic printing may be adjusted to have a suitable contact angle. The display elements can be dispersed in a suitable carrier fluid such as water or an organic solvent that is dried after coating. The carrier fluid can also contain agents to modify surface tension, contact angle, viscosity, or electrical conductivity. The binder phase may contain monomers, oligomers, polymers, or polymerization inhibitors. These components can be used to form physically robust display element layers.

In one embodiment the display elements could be dispersed in a low viscosity water solution containing a polymer. This solution could be inkjet printed in registration with the appropriate electrode pattern. In another embodiment the display element can be dispersed in an ultraviolet-curable resin used in lithographic printing processes, deposited on the appropriate electrodes by a lithographic process, and cured to form the display element layer. In all cases, the display elements are printed in substantial registration with the appropriate electrodes.

In other embodiments, the electronic ink is coated onto the substrate using an appropriate coating method such as knife-over-roll coating, silk-screen printing processes, brushing or other non-patterned coating techniques. In these embodiments, an electric signal is applied to the electrode to which the display elements should be registered. Application of an electric signal attracts the display elements proximate the electrode. For certain embodiments employing a carrier, the applied signal overcomes the forces holding the display elements to the carrier and transfers the elements to the substrate adjacent the electrode. The display elements can be dispersed in a low viscosity liquid, such as low molecular weight hydrocarbons like methylethylketone or cyclohexane, or alcohols such as ethanol or propanol. The display elements are then treated to produce a controlled surface charge by, for example, adjusting the pH of the dispersing liquid or adding surface active agents such as soaps, detergents, or other dispersants. Because the charge of the display elements is controlled, an electric charge can be use to transfer the display elements to the appropriate electrode.

Other display elements may then be removed from the substrate, e.g. by washing the substrate, to leave only the display elements that are proximate to the electrode. A second plurality of electrophoretic display elements are selectively deposited on the substrate in substantial registration with another electrode (step 506) using techniques similar to those just described. The technique used to selectively deposit the first plurality of display elements need not be the same technique as that used to selectively deposit the second plurality of display elements.

This technique for printing displays can be used to build the rear electrode structure on a display or to construct two separate layers that are laminated together to form the display. For example an electronically active ink may be printed on an indium tin oxide electrode. Separately, a rear electrode structure as described above can be printed on a suitable substrate, such as plastic, polymer films, or glass. The electrode structure and the display element can be laminated to form a display.

While the examples described here are listed using encapsulated electrophoretic displays, there are other particle-based display media which should also work as well, including encapsulated suspended particles and rotating ball displays.

While the invention has been particularly shown and described with reference to specific preferred embodiments, it should be understood by those skilled in the art that various changes in form and detail may be made therein without departing from the spirit And scope of the invention as defined by the appended claims.

What is claimed is:

1. A color electrophoretic display comprising:
   a first reflective surface comprising a first electrode of a first color and a second electrode of a second color;
   a first display element comprising a plurality of first species of electrophoretic particles of said second color, said first reflective surface disposed adjacent a rear side of said first display element opposite its viewing side, said first element displaying said first color when said first reflective surface is substantially visible and displaying said second color when said first reflective surface is substantially obscured by said first species of particles;
   a second reflective surface comprising a third electrode of a third color and a fourth electrode of a fourth color;
   a second display element comprising a plurality of second species of electrophoretic particles of said fourth color, said second reflective surface disposed adjacent a rear side of said second display element opposite its viewing side, said second element displaying said third color when said second reflective surface is substantially visible and displaying said fourth color when said second reflective surface is substantially obscured by said second species of particles;
   a third reflective surface comprising a fifth electrode of a fifth color and a sixth electrode of a sixth color; and
   a third display element comprising a plurality of third species of electrophoretic particles of said sixth color, said third reflective surface disposed adjacent a rear side of said third display element opposite its viewing side, said third element displaying said fifth color when said third reflective surface is substantially visible and displaying said sixth color when said third reflective surface is substantially obscured by said third species of particles.

2. The color electrophoretic display of claim 1 wherein said first color is red, said third color is green and said fifth color is blue.

3. The color electrophoretic display of claim 1 wherein said first color is cyan, said third color is yellow and said fifth color is magenta.

4. The color electrophoretic display of claim 1 wherein said second, fourth and sixth colors are each selected from the group consisting of black and white.

5. A color electrophoretic display comprising:
   a reflective surface comprising a first electrode of a first color and a second electrode of a second color;
   a display element comprising a plurality of a species of electrophoretic particles of said second color, said reflective surface disposed adjacent a rear side of said display element opposite its viewing side, said display element displaying said first color when said reflective surface is substantially visible and displaying said second color when said reflective surface is substantially obscured by said species of particles.

6. The color electrophoretic display of claim 5 wherein said first color is any one of red, green and blue.

7. The color electrophoretic display of claim 5 wherein said first color is any one of cyan, yellow and magenta.

8. The color electrophoretic display of claim 5 wherein said second color is selected from the group consisting of black and white.

* * * * *